United States Patent
Turney et al.

(10) Patent No.: US 11,507,033 B2
(45) Date of Patent: Nov. 22, 2022

(54) HVAC CONTROL SYSTEM WITH MODEL DRIVEN DEEP LEARNING

(71) Applicant: Johnson Controls Technology Company, Auburn Hills, MI (US)

(72) Inventors: Robert D. Turney, Watertown, WI (US); Henry O. Marcy, V, Milwaukee, WI (US)

(73) Assignee: Johnson Controls Tyco IP Holdings LLP, Milwaukee, WI (US)

( * ) Notice: Subject to any disclaimer, the term of this patent is extended or adjusted under 35 U.S.C. 154(b) by 788 days.

(21) Appl. No.: 16/413,946

(22) Filed: May 16, 2019

(65) Prior Publication Data

US 2019/0354071 A1    Nov. 21, 2019

Related U.S. Application Data

(60) Provisional application No. 62/673,479, filed on May 18, 2018, provisional application No. 62/673,496, filed on May 18, 2018.

(51) Int. Cl.
*G05B 13/02* (2006.01)
*G06N 3/08* (2006.01)
*G06F 30/20* (2020.01)

(52) U.S. Cl.
CPC .......... *G05B 13/027* (2013.01); *G06F 30/20* (2020.01); *G06N 3/08* (2013.01)

(58) Field of Classification Search
CPC ....... G05B 13/027; G06F 30/20; G06F 30/27; G06N 3/08; G06N 3/0454

(Continued)

(56) References Cited

U.S. PATENT DOCUMENTS

| 7,716,147 B2 * | 5/2010 | Kelly ....................... G06N 3/08 706/15 |
| 2007/0094171 A1 * | 4/2007 | Burges ..................... G06N 3/08 706/16 |

(Continued)

FOREIGN PATENT DOCUMENTS

| JP | H09-159284 | 6/1997 |
| JP | 2003-084805 | 3/2003 |
| JP | 2017-067427 | 4/2017 |

OTHER PUBLICATIONS

Office Action on JP 2019-091950, dated Mar. 30, 2021, 6 pages including English language translation.

(Continued)

*Primary Examiner* — Paul Dinh
(74) *Attorney, Agent, or Firm* — Foley & Lardner LLP

(57) ABSTRACT

A method includes operating equipment to affect a variable state or condition of a space and determining a set of learned weights for a neural network by modeling an estimated cost of operating the equipment over a plurality of simulated scenarios. Each simulated scenario includes simulated measurements relating to the space. The neural network is configured to generate simulated control dispatches for the equipment based on the simulated measurements. The method also includes configuring the neural network for online control by applying the set of learned weights, applying actual measurements relating to the space to the neural network to generate a control dispatch for the equipment, and controlling the equipment in accordance with the control dispatch.

20 Claims, 12 Drawing Sheets

(58) Field of Classification Search
USPC .......................................................... 706/16
See application file for complete search history.

(56) References Cited

U.S. PATENT DOCUMENTS

2015/0170024 A1* 6/2015 Chatterjee ............... G06F 3/016
706/16
2018/0224814 A1 8/2018 Elbsat et al.

OTHER PUBLICATIONS

U.S. Appl. No. 15/953,324, filed Apr. 13, 2018, Johnson Controls Technology Company.
Office Action on JP 2019-091950, dated Aug. 4, 2020, 8 pages with English language translation.
JP Office Action on JP Appl. Ser. No. 2021-118668 dated Sep. 13, 2022, with translation (8 pages).

* cited by examiner

HVAC CONTROL SYSTEM WITH MODEL DRIVEN DEEP LEARNING

CROSS-REFERENCE TO RELATED APPLICATIONS

This application claims the benefit of and priority to U.S. Provisional Application No. 62/673,479, filed May 18, 2018, and U.S. Provisional Application No. 62/673,496, filed May 18, 2018, both of which are incorporated by reference herein in their entireties.

BACKGROUND

The present disclosure relates generally to managing energy costs in variable refrigerant flow (VRF) systems, room air conditioning (RAC) systems, or packaged air conditioning (PAC) systems that provide temperature control for a building. Minimizing energy consumption of such systems may lead to discomfort for occupants of the building because comfortable temperatures cannot be maintained without increased power, while precisely matching occupant preferences at all times typically leads to high energy costs. Thus, systems and methods are needed to reduce energy consumption of VRF, RAC, and PAC systems without leading to occupant discomfort.

SUMMARY

One implementation of the present disclosure is a method. The method includes operating equipment to affect a variable state or condition of a space and determining a set of learned weights for a neural network by modeling an estimated cost of operating the equipment over a plurality of simulated scenarios. Each simulated scenario includes simulated measurements relating to the space. The neural network is configured to generate simulated control dispatches for the equipment based on the simulated measurements. The method also includes configuring the neural network for online control by applying the set of learned weights, applying actual measurements relating to the space to the neural network to generate a control dispatch for the equipment, and controlling the equipment in accordance with the control dispatch.

In some embodiments, the set of learned weights are determined as a set of weights that minimize the estimated cost of operating the equipment over the plurality of simulated scenarios.

In some embodiments, determining the set of learned weights includes identifying a state-space thermal model for the space, defining a cost function using the state-space thermal model, generating, by the neural network for each scenario, a simulated control dispatch based the simulated measurements for the scenario and a set of weights, and calculating, using the cost function, the estimated cost of operating the equipment over a simulated time period for the scenario given the simulated control dispatch and the set of simulated measurements. Determining the set of learned weights may also include modifying the set of weights to drive the cost toward a minimum of the cost function, and determining the set of learned weights as the set of weights that results in a minimum cost over the plurality of scenarios.

In some embodiments, the control dispatch includes one or more of a temperature setpoint, temperature schedule, humidity setpoint, airflow setpoint, power level, on/off setting, damper position, fan speed, compressor frequency, or resource consumption allocation. In some embodiments, the equipment includes one or more of an airside system or a waterside system. In some embodiments, the equipment includes one or more of a variable refrigerant flow system, a room air conditioner, or a packaged air conditioner.

Another implementation of the present disclosure is a system. The system includes HVAC equipment operable to affect a variable state or condition of a space, one or more sensors configured to collect measurements relating to the space, and an offline training system configured to determine a set of learned weights for a neural network by modeling an estimated cost of operating the HVAC equipment over a plurality of simulated scenarios. Each simulated scenario includes simulated measurements relating to the space. The neural network is configured to generate simulated control dispatches for the HVAC equipment based on the simulated measurements. The system also includes an online control circuit configured to apply the measurements from the one or more sensors to the neural network to generate a control dispatch for the HVAC equipment with the neural network configured in accordance with the set of learned weights and control the HVAC equipment in accordance with the control dispatch.

In some embodiments, the offline training system is configured to determine the set of learned weights as a set of weights that minimize the estimated cost of operating the equipment over the plurality of simulated scenarios. In some embodiments, the offline training system is configured to identify a state-space thermal model for the space, define a cost function using the state-space thermal model, generate, with the neural network and for each scenario, a simulated control dispatch based the simulated measurements for the scenario and a set of weights, and calculate, using the cost function, the estimated cost of operating the HVAC equipment over a simulated time period for the scenario given the simulated control dispatch and the set of simulated measurements. In some embodiments, the offline training system is configured to modify the set of weights to drive the cost toward a minimum of the cost function, and determine the set of learned weights as the set of weights that results in a minimum cost over the plurality of scenarios.

In some embodiments, the HVAC equipment includes one or more of an airside system or a waterside system. In some embodiments, the online control circuit is included locally with the HVAC equipment and the offline training system includes one or more cloud-computing resources.

Another implementation of the present disclosure is a system. The system includes a cooling device operable to affect a temperature of a space, one or more sensors configured to collect measurements relating to the space, and an offline training system configured to determine a set of learned weights for a neural network by modeling an estimated cost of operating the cooling device over a plurality of simulated scenarios. Each simulated scenario includes simulated measurements relating to the space. The neural network is configured to generate simulated control dispatches for the cooling device based on the simulated measurements. The system also includes an online control circuit configured to apply the measurements from the one or more sensors to the neural network to generate a control dispatch for the cooling device with the neural network configured in accordance with the set of learned weights and control the cooling device in accordance with the control dispatch.

In some embodiments, the offline training system is configured to determine the set of learned weights as a set of weights that minimize the estimated cost of operating the cooling device over the plurality of simulated scenarios. In some embodiments, the offline training system is configured to identify a state-space thermal model for the space, define a cost function using the state-space thermal model, generate, with the neural network and for each scenario, a simulated control dispatch based the simulated measurements for the scenario and a set of weights, and calculate, using the cost function, the estimated cost of operating the cooling device over a simulated time period for the scenario given the simulated control dispatch and the set of simulated measurements. In some embodiments, the offline training system is configured to modify the set of weights to drive the cost toward a minimum of the cost function and determine the set of learned weights as the set of weights that results in a minimum cost over the plurality of scenarios.

In some embodiments, the cooling device includes one or more of a room air conditioner, a packaged air conditioner, or a variable refrigerant flow device. In some embodiments, the online control circuit is included locally with the cooling device and the offline training system includes one or more cloud-computing resources. In some embodiments, the control dispatch includes a temperature setpoint

DETAILED DESCRIPTION

Building HVAC Systems and Building Management Systems

Figure 1:
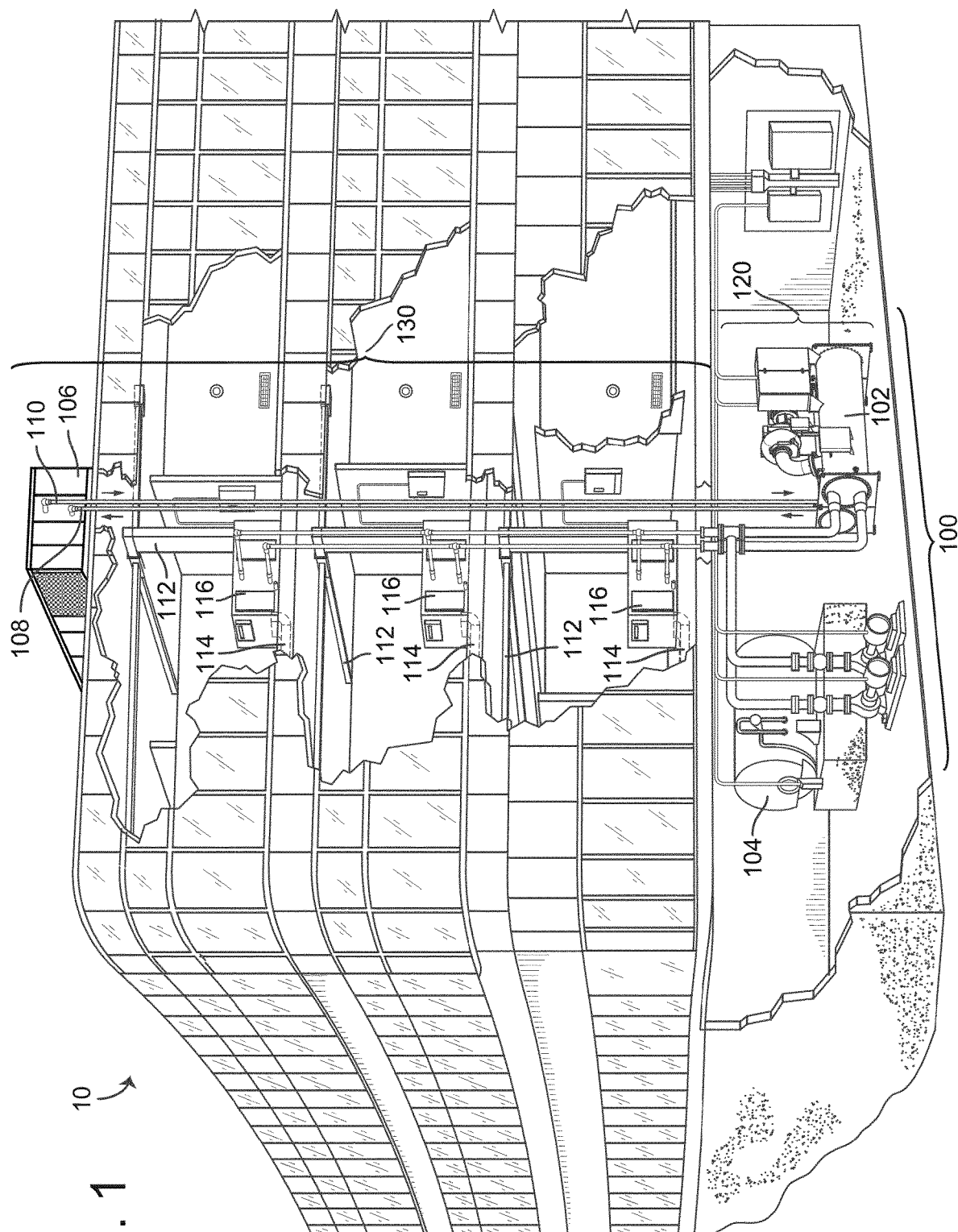
FIG. 1 is a drawing of a building equipped with a HVAC system, according to an exemplary embodiment.
Figure 2:
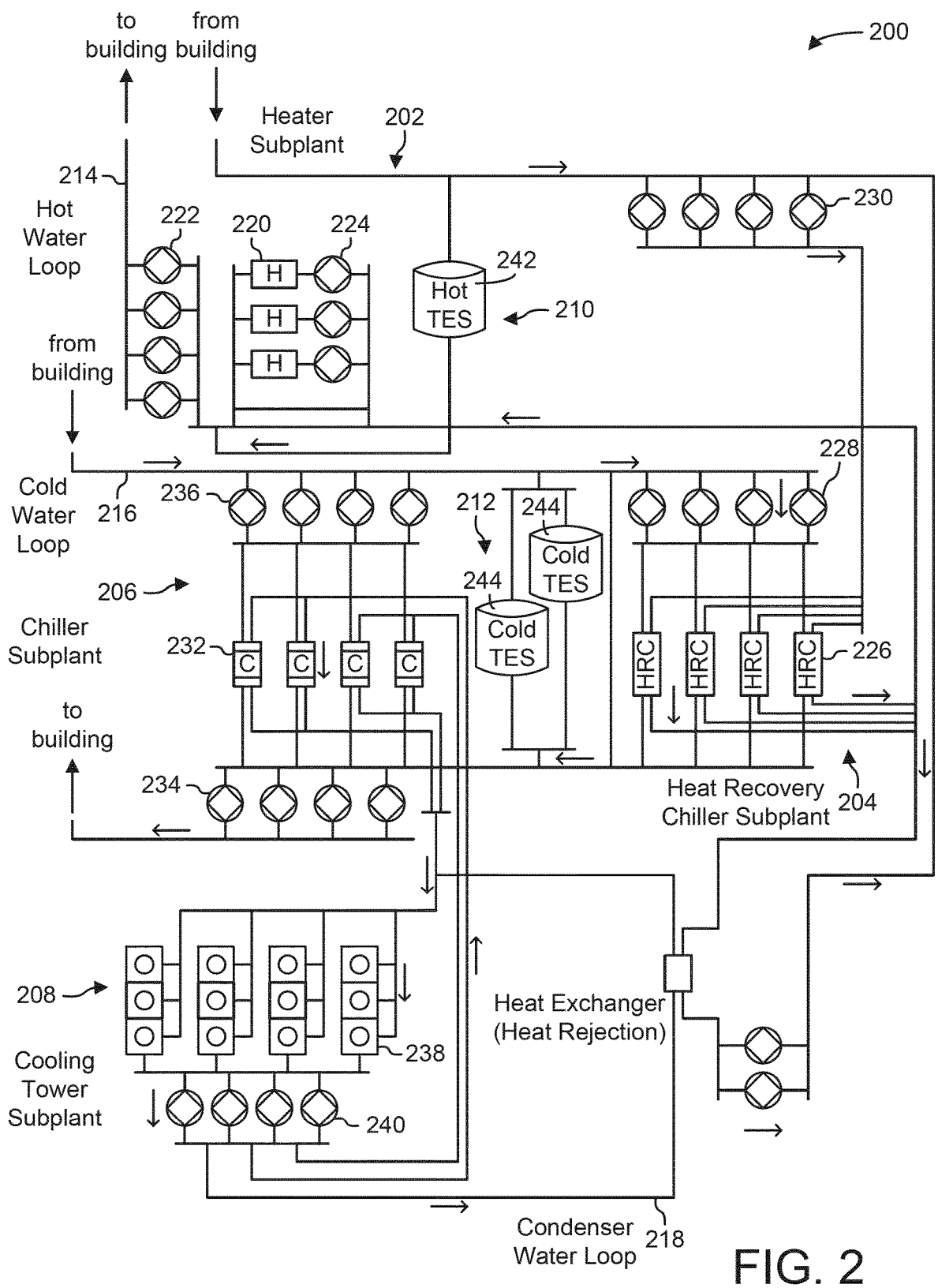
FIG. 2 is a block diagram of a waterside system which can be used to serve the building of FIG. 1, according to an exemplary embodiment.
Figure 3:
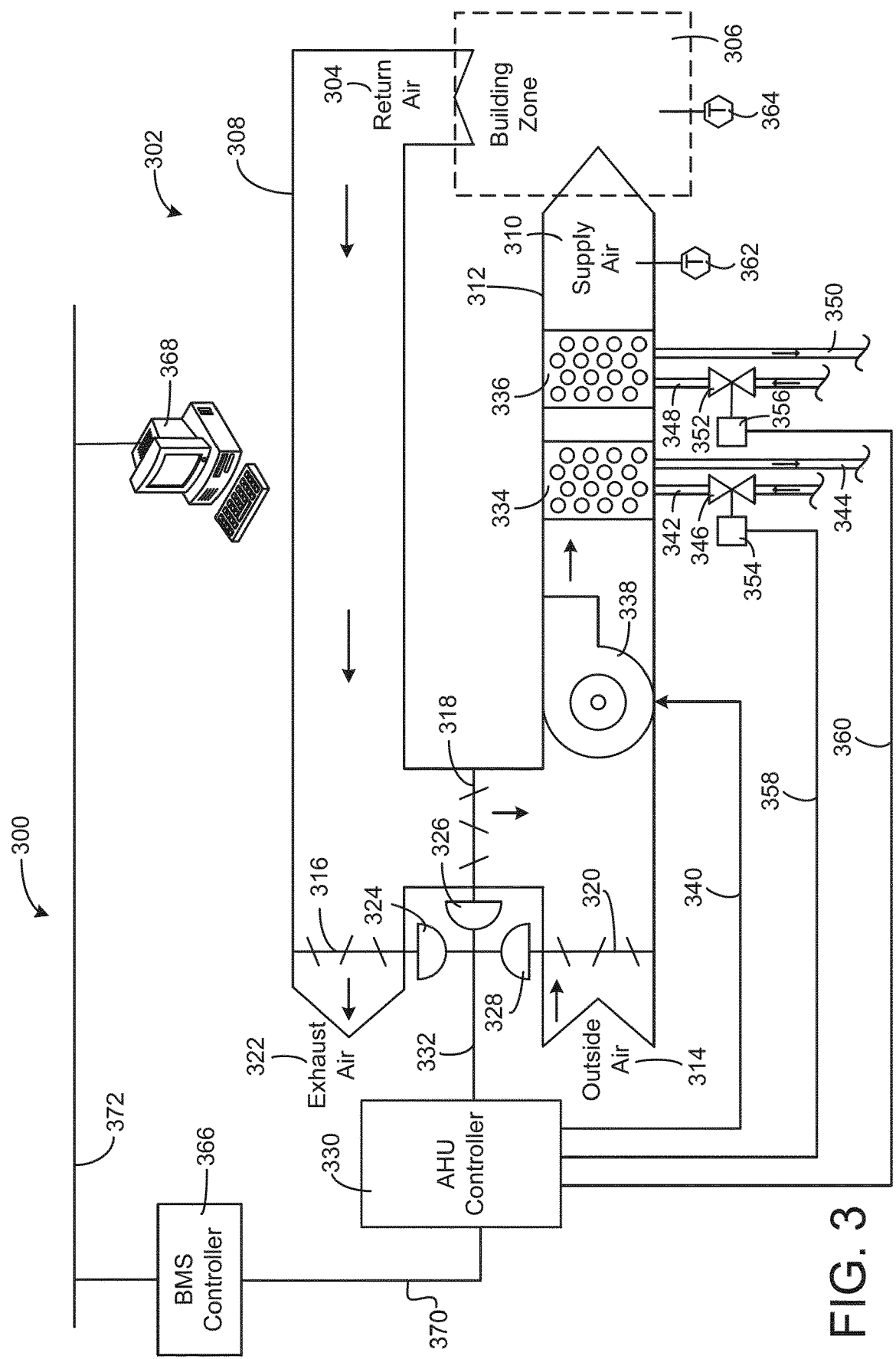
FIG. 3 is a block diagram of an airside system which can be used to serve the building of FIG. 1, according to an exemplary embodiment.
Figure 4:
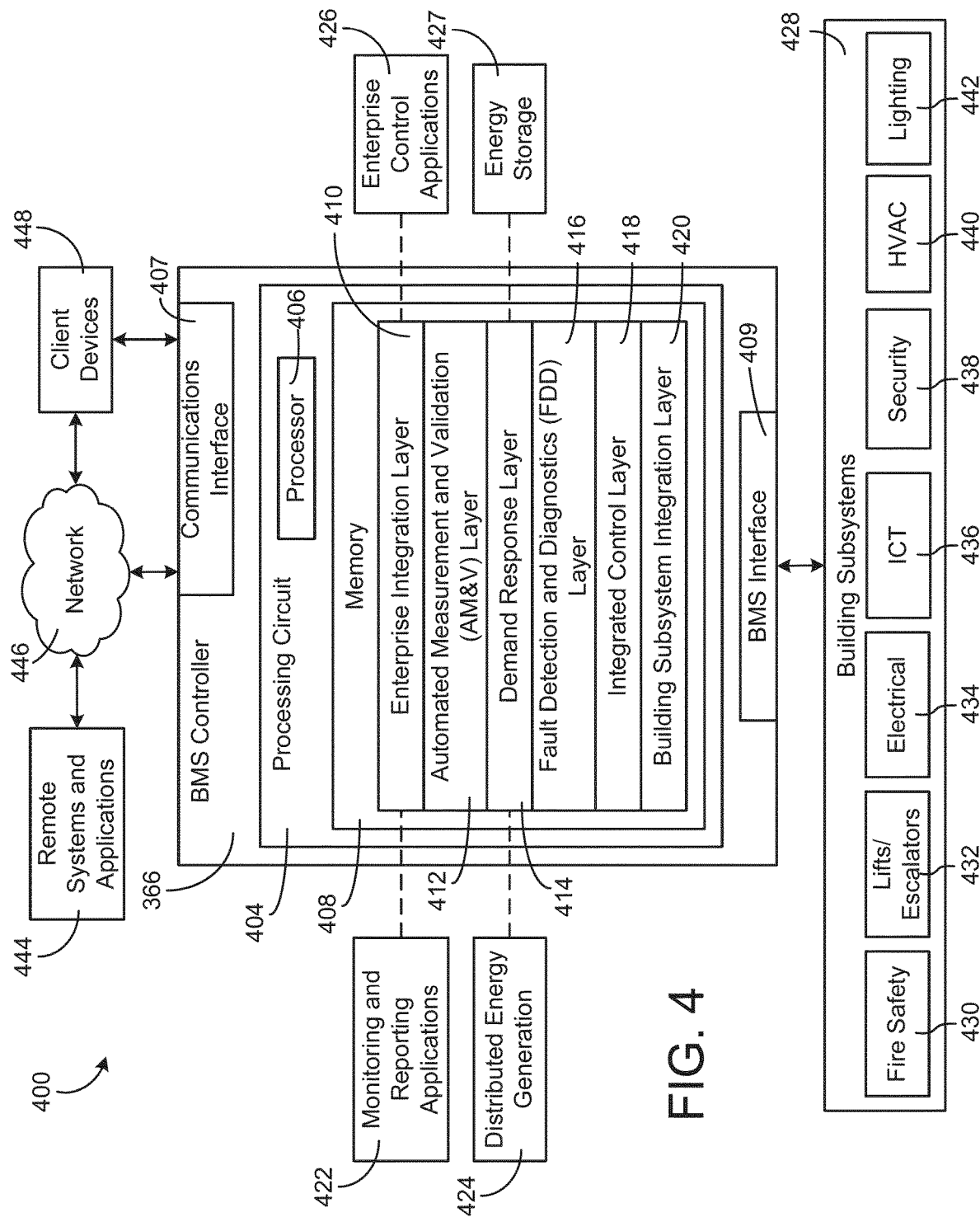
FIG. 4 is a block diagram of a building management system (BMS) which can be used to monitor and control the building of FIG. 1, according to an exemplary embodiment.
Figure 5:
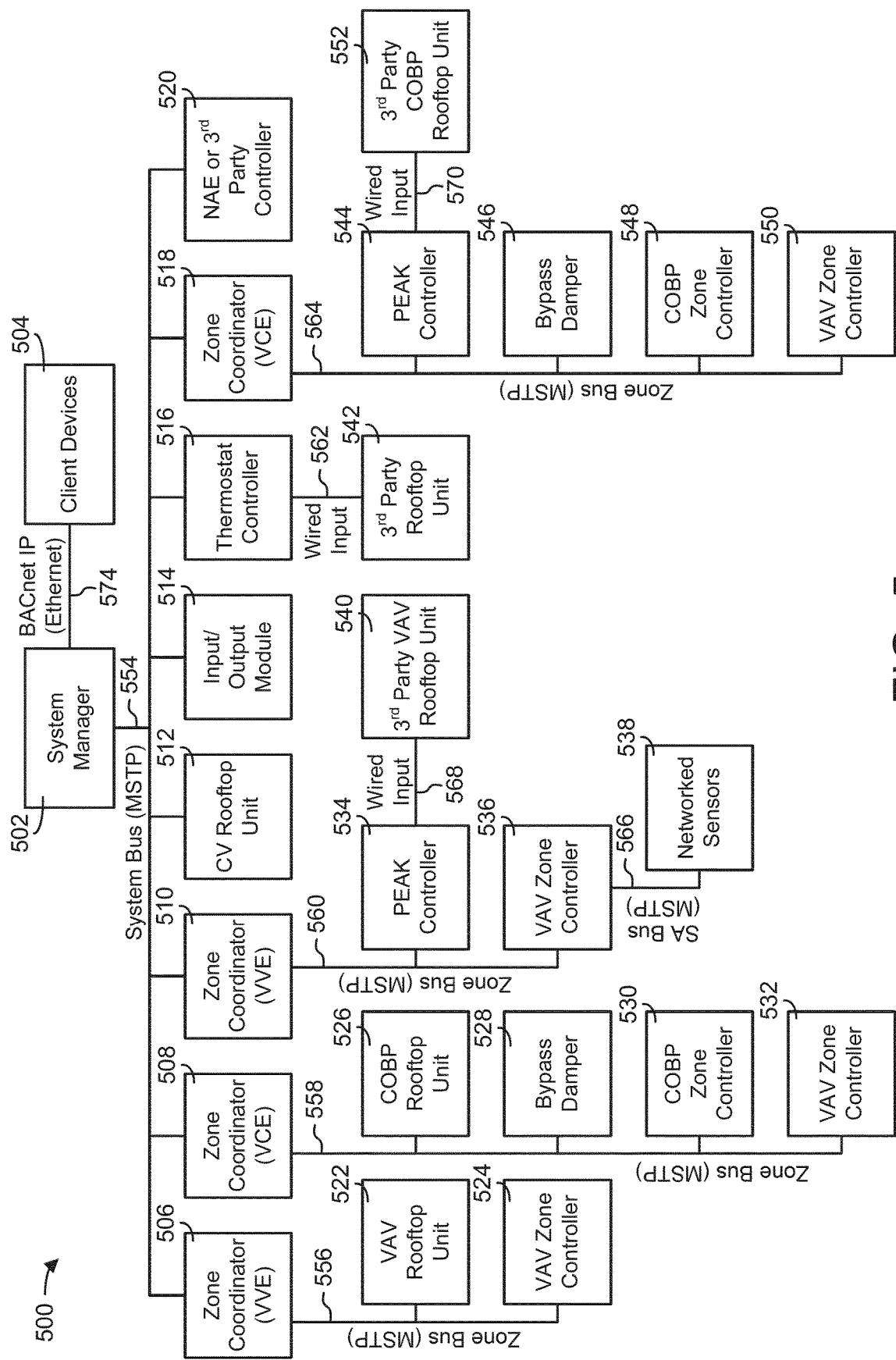
FIG. 5 is a block diagram of another BMS which can be used to monitor and control the building of FIG. 1, according to an exemplary embodiment.

Referring now to FIGS. 1-5, several building management systems (BMS) and HVAC systems in which the systems and methods of the present disclosure can be implemented are shown, according to some embodiments. In brief overview, FIG. 1 shows a building 10 equipped with a HVAC system 100. FIG. 2 is a block diagram of a waterside system 200 which can be used to serve building 10. FIG. 3 is a block diagram of an airside system 300 which can be used to serve building 10. FIG. 4 is a block diagram of a BMS which can be used to monitor and control building 10. FIG. 5 is a block diagram of another BMS which can be used to monitor and control building 10.

Building and HVAC System

Referring particularly to FIG. 1, a perspective view of a building 10 is shown. Building 10 is served by a BMS. A BMS is, in general, a system of devices configured to control, monitor, and manage equipment in or around a building or building area. A BMS can include, for example, a HVAC system, a security system, a lighting system, a fire alerting system, any other system that is capable of managing building functions or devices, or any combination thereof.

The BMS that serves building 10 includes a HVAC system 100. HVAC system 100 can include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 may provide a heated or chilled fluid to an air handling unit of airside system 130. Airside system 130 may use the heated or chilled fluid to heat or cool an airflow provided to building 10. An exemplary waterside system and airside system which can be used in HVAC system 100 are described in greater detail with reference to FIGS. 2-3.

HVAC system 100 is shown to include a chiller 102, a boiler 104, and a rooftop air handling unit (AHU) 106. Waterside system 120 may use boiler 104 and chiller 102 to heat or cool a working fluid (e.g., water, glycol, etc.) and may circulate the working fluid to AHU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 may add heat to the circulated fluid, for example, by burning a combustible material (e.g., natural gas) or using an electric heating element. Chiller 102 may place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to AHU 106 via piping 108.

AHU 106 may place the working fluid in a heat exchange relationship with an airflow passing through AHU 106 (e.g., via one or more stages of cooling coils and/or heating coils). The airflow can be, for example, outside air, return air from within building 10, or a combination of both. AHU 106 may transfer heat between the airflow and the working fluid to provide heating or cooling for the airflow. For example, AHU 106 can include one or more fans or blowers configured to pass the airflow over or through a heat exchanger containing the working fluid. The working fluid may then return to chiller 102 or boiler 104 via piping 110.

Airside system 130 may deliver the airflow supplied by AHU 106 (i.e., the supply airflow) to building 10 via air supply ducts 112 and may provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 can include various sensors (e.g., temperature sensors, pressure sensors, etc.) configured to measure attributes of the supply airflow. AHU 106 may receive input from sensors located within AHU 106 and/or within the building zone and may adjust the flow rate, temperature, or other attributes of the supply airflow through AHU 106 to achieve setpoint conditions for the building zone.

Waterside System

Referring now to FIG. 2, a block diagram of a waterside system 200 is shown, according to some embodiments. In various embodiments, waterside system 200 may supplement or replace waterside system 120 in HVAC system 100 or can be implemented separate from HVAC system 100. When implemented in HVAC system 100, waterside system 200 can include a subset of the HVAC devices in HVAC system 100 (e.g., boiler 104, chiller 102, pumps, valves, etc.) and may operate to supply a heated or chilled fluid to AHU 106. The HVAC devices of waterside system 200 can be located within building 10 (e.g., as components of waterside system 120) or at an offsite location such as a central plant.

In FIG. 2, waterside system 200 is shown as a central plant having a plurality of subplants 202-212. Subplants 202-212 are shown to include a heater subplant 202, a heat recovery chiller subplant 204, a chiller subplant 206, a cooling tower subplant 208, a hot thermal energy storage (TES) subplant 210, and a cold thermal energy storage (TES) subplant 212. Subplants 202-212 consume resources (e.g., water, natural gas, electricity, etc.) from utilities to serve thermal energy loads (e.g., hot water, cold water, heating, cooling, etc.) of a building or campus. For example, heater subplant 202 can be configured to heat water in a hot water loop 214 that circulates the hot water between heater subplant 202 and building 10. Chiller subplant 206 can be configured to chill water in a cold water loop 216 that circulates the cold water between chiller subplant 206 building 10. Heat recovery chiller subplant 204 can be configured to transfer heat from cold water loop 216 to hot water loop 214 to provide additional heating for the hot water and additional cooling for the cold water. Condenser water loop 218 may absorb heat from the cold water in chiller subplant 206 and reject the absorbed heat in cooling tower subplant 208 or transfer the absorbed heat to hot water loop 214. Hot TES subplant 210 and cold TES subplant 212 may store hot and cold thermal energy, respectively, for subsequent use.

Hot water loop 214 and cold water loop 216 may deliver the heated and/or chilled water to air handlers located on the rooftop of building 10 (e.g., AHU 106) or to individual floors or zones of building 10 (e.g., VAV units 116). The air handlers push air past heat exchangers (e.g., heating coils or cooling coils) through which the water flows to provide heating or cooling for the air. The heated or cooled air can be delivered to individual zones of building 10 to serve thermal energy loads of building 10. The water then returns to subplants 202-212 to receive further heating or cooling.

Although subplants 202-212 are shown and described as heating and cooling water for circulation to a building, it is understood that any other type of working fluid (e.g., glycol, CO2, etc.) can be used in place of or in addition to water to serve thermal energy loads. In other embodiments, subplants 202-212 may provide heating and/or cooling directly to the building or campus without requiring an intermediate heat transfer fluid. These and other variations to waterside system 200 are within the teachings of the present disclosure.

Each of subplants 202-212 can include a variety of equipment configured to facilitate the functions of the subplant. For example, heater subplant 202 is shown to include a plurality of heating elements 220 (e.g., boilers, electric heaters, etc.) configured to add heat to the hot water in hot water loop 214. Heater subplant 202 is also shown to include several pumps 222 and 224 configured to circulate the hot water in hot water loop 214 and to control the flow rate of the hot water through individual heating elements 220. Chiller subplant 206 is shown to include a plurality of chillers 232 configured to remove heat from the cold water in cold water loop 216. Chiller subplant 206 is also shown to include several pumps 234 and 236 configured to circulate the cold water in cold water loop 216 and to control the flow rate of the cold water through individual chillers 232.

Heat recovery chiller subplant 204 is shown to include a plurality of heat recovery heat exchangers 226 (e.g., refrigeration circuits) configured to transfer heat from cold water loop 216 to hot water loop 214. Heat recovery chiller subplant 204 is also shown to include several pumps 228 and 230 configured to circulate the hot water and/or cold water through heat recovery heat exchangers 226 and to control the flow rate of the water through individual heat recovery heat exchangers 226. Cooling tower subplant 208 is shown to include a plurality of cooling towers 238 configured to remove heat from the condenser water in condenser water loop 218. Cooling tower subplant 208 is also shown to include several pumps 240 configured to circulate the condenser water in condenser water loop 218 and to control the flow rate of the condenser water through individual cooling towers 238.

Hot TES subplant 210 is shown to include a hot TES tank 242 configured to store the hot water for later use. Hot TES subplant 210 may also include one or more pumps or valves configured to control the flow rate of the hot water into or out of hot TES tank 242. Cold TES subplant 212 is shown to include cold TES tanks 244 configured to store the cold water for later use. Cold TES subplant 212 may also include one or more pumps or valves configured to control the flow rate of the cold water into or out of cold TES tanks 244.

In some embodiments, one or more of the pumps in waterside system 200 (e.g., pumps 222, 224, 228, 230, 234, 236, and/or 240) or pipelines in waterside system 200 include an isolation valve associated therewith. Isolation valves can be integrated with the pumps or positioned upstream or downstream of the pumps to control the fluid flows in waterside system 200. In various embodiments, waterside system 200 can include more, fewer, or different types of devices and/or subplants based on the particular configuration of waterside system 200 and the types of loads served by waterside system 200.

Airside System

Referring now to FIG. 3, a block diagram of an airside system 300 is shown, according to some embodiments. In various embodiments, airside system 300 may supplement or replace airside system 130 in HVAC system 100 or can be implemented separate from HVAC system 100. When implemented in HVAC system 100, airside system 300 can include a subset of the HVAC devices in HVAC system 100 (e.g., AHU 106, VAV units 116, ducts 112-114, fans, dampers, etc.) and can be located in or around building 10. Airside system 300 may operate to heat or cool an airflow provided to building 10 using a heated or chilled fluid provided by waterside system 200.

In FIG. 3, airside system 300 is shown to include an economizer-type air handling unit (AHU) 302. Economizer-type AHUs vary the amount of outside air and return air used by the air handling unit for heating or cooling. For example, AHU 302 may receive return air 304 from building zone 306 via return air duct 308 and may deliver supply air 310 to building zone 306 via supply air duct 312. In some embodiments, AHU 302 is a rooftop unit located on the roof of building 10 (e.g., AHU 106 as shown in FIG. 1) or otherwise positioned to receive both return air 304 and outside air 314. AHU 302 can be configured to operate exhaust air damper 316, mixing damper 318, and outside air damper 320 to control an amount of outside air 314 and return air 304 that combine to form supply air 310. Any return air 304 that does not pass through mixing damper 318 can be exhausted from AHU 302 through exhaust damper 316 as exhaust air 322.

Each of dampers 316-320 can be operated by an actuator. For example, exhaust air damper 316 can be operated by actuator 324, mixing damper 318 can be operated by actuator 326, and outside air damper 320 can be operated by actuator 328. Actuators 324-328 may communicate with an AHU controller 330 via a communications link 332. Actuators 324-328 may receive control signals from AHU controller 330 and may provide feedback signals to AHU controller 330. Feedback signals can include, for example, an indication of a current actuator or damper position, an amount of torque or force exerted by the actuator, diagnostic information (e.g., results of diagnostic tests performed by actuators 324-328), status information, commissioning information, configuration settings, calibration data, and/or other types of information or data that can be collected, stored, or used by actuators 324-328. AHU controller 330 can be an economizer controller configured to use one or more control algorithms (e.g., state-based algorithms, extremum seeking control (ESC) algorithms, proportional-integral (PI) control algorithms, proportional-integral-derivative (PID) control algorithms, model predictive control (MPC) algorithms, feedback control algorithms, etc.) to control actuators 324-328.

Still referring to FIG. 3, AHU 302 is shown to include a cooling coil 334, a heating coil 336, and a fan 338 positioned within supply air duct 312. Fan 338 can be configured to force supply air 310 through cooling coil 334 and/or heating coil 336 and provide supply air 310 to building zone 306. AHU controller 330 may communicate with fan 338 via communications link 340 to control a flow rate of supply air 310. In some embodiments, AHU controller 330 controls an amount of heating or cooling applied to supply air 310 by modulating a speed of fan 338.

Cooling coil 334 may receive a chilled fluid from waterside system 200 (e.g., from cold water loop 216) via piping 342 and may return the chilled fluid to waterside system 200 via piping 344. Valve 346 can be positioned along piping 342 or piping 344 to control a flow rate of the chilled fluid through cooling coil 334. In some embodiments, cooling coil 334 includes multiple stages of cooling coils that can be independently activated and deactivated (e.g., by AHU controller 330, by BMS controller 366, etc.) to modulate an amount of cooling applied to supply air 310.

Heating coil 336 may receive a heated fluid from waterside system 200 (e.g., from hot water loop 214) via piping 348 and may return the heated fluid to waterside system 200 via piping 350. Valve 352 can be positioned along piping 348 or piping 350 to control a flow rate of the heated fluid through heating coil 336. In some embodiments, heating coil 336 includes multiple stages of heating coils that can be independently activated and deactivated (e.g., by AHU controller 330, by BMS controller 366, etc.) to modulate an amount of heating applied to supply air 310.

Each of valves 346 and 352 can be controlled by an actuator. For example, valve 346 can be controlled by actuator 354 and valve 352 can be controlled by actuator 356. Actuators 354-356 may communicate with AHU controller 330 via communications links 358-360. Actuators 354-356 may receive control signals from AHU controller 330 and may provide feedback signals to controller 330. In some embodiments, AHU controller 330 receives a measurement of the supply air temperature from a temperature sensor 362 positioned in supply air duct 312 (e.g., downstream of cooling coil 334 and/or heating coil 336). AHU controller 330 may also receive a measurement of the temperature of building zone 306 from a temperature sensor 364 located in building zone 306.

In some embodiments, AHU controller 330 operates valves 346 and 352 via actuators 354-356 to modulate an amount of heating or cooling provided to supply air 310 (e.g., to achieve a setpoint temperature for supply air 310 or to maintain the temperature of supply air 310 within a setpoint temperature range). The positions of valves 346 and 352 affect the amount of heating or cooling provided to supply air 310 by cooling coil 334 or heating coil 336 and may correlate with the amount of energy consumed to achieve a desired supply air temperature. AHU 330 may control the temperature of supply air 310 and/or building zone 306 by activating or deactivating coils 334-336, adjusting a speed of fan 338, or a combination of both.

Still referring to FIG. 3, airside system 300 is shown to include a building management system (BMS) controller 366 and a client device 368. BMS controller 366 can include one or more computer systems (e.g., servers, supervisory controllers, subsystem controllers, etc.) that serve as system level controllers, application or data servers, head nodes, or master controllers for airside system 300, waterside system 200, HVAC system 100, and/or other controllable systems that serve building 10. BMS controller 366 may communicate with multiple downstream building systems or subsystems (e.g., HVAC system 100, a security system, a lighting system, waterside system 200, etc.) via a communications link 370 according to like or disparate protocols (e.g., LON, BACnet, etc.). In various embodiments, AHU controller 330 and BMS controller 366 can be separate (as shown in FIG. 3) or integrated. In an integrated implementation, AHU controller 330 can be a software module configured for execution by a processor of BMS controller 366.

In some embodiments, AHU controller 330 receives information from BMS controller 366 (e.g., commands, setpoints, operating boundaries, etc.) and provides information to BMS controller 366 (e.g., temperature measurements, valve or actuator positions, operating statuses, diagnostics, etc.). For example, AHU controller 330 may provide BMS controller 366 with temperature measurements from temperature sensors 362-364, equipment on/off states, equipment operating capacities, and/or any other information that can be used by BMS controller 366 to monitor or control a variable state or condition within building zone 306.

Client device 368 can include one or more human-machine interfaces or client interfaces (e.g., graphical user interfaces, reporting interfaces, text-based computer interfaces, client-facing web services, web servers that provide pages to web clients, etc.) for controlling, viewing, or otherwise interacting with HVAC system 100, its subsystems, and/or devices. Client device 368 can be a computer workstation, a client terminal, a remote or local interface, or any other type of user interface device. Client device 368 can be a stationary terminal or a mobile device. For example, client device 368 can be a desktop computer, a computer server with a user interface, a laptop computer, a tablet, a smartphone, a PDA, or any other type of mobile or non-mobile device. Client device 368 may communicate with BMS controller 366 and/or AHU controller 330 via communications link 372.

Building Management Systems

Referring now to FIG. 4, a block diagram of a building management system (BMS) 400 is shown, according to some embodiments. BMS 400 can be implemented in building 10 to automatically monitor and control various building functions. BMS 400 is shown to include BMS controller 366 and a plurality of building subsystems 428. Building subsystems 428 are shown to include a building electrical subsystem 434, an information communication technology (ICT) subsystem 436, a security subsystem 438, a HVAC subsystem 440, a lighting subsystem 442, a lift/escalators subsystem 432, and a fire safety subsystem 430. In various embodiments, building subsystems 428 can include fewer, additional, or alternative subsystems. For example, building subsystems 428 may also or alternatively include a refrigeration subsystem, an advertising or signage subsystem, a cooking subsystem, a vending subsystem, a printer or copy service subsystem, or any other type of building subsystem that uses controllable equipment and/or sensors to monitor or control building 10. In some embodiments, building subsystems 428 include waterside system 200 and/or airside system 300, as described with reference to FIGS. 2-3.

Each of building subsystems 428 can include any number of devices, controllers, and connections for completing its individual functions and control activities. HVAC subsystem 440 can include many of the same components as HVAC system 100, as described with reference to FIGS. 1-3. For example, HVAC subsystem 440 can include a chiller, a boiler, any number of air handling units, economizers, field controllers, supervisory controllers, actuators, temperature sensors, and other devices for controlling the temperature, humidity, airflow, or other variable conditions within building 10. Lighting subsystem 442 can include any number of light fixtures, ballasts, lighting sensors, dimmers, or other devices configured to controllably adjust the amount of light provided to a building space. Security subsystem 438 can include occupancy sensors, video surveillance cameras, digital video recorders, video processing servers, intrusion detection devices, access control devices and servers, or other security-related devices.

Still referring to FIG. 4, BMS controller 366 is shown to include a communications interface 407 and a BMS interface 409. Interface 407 may facilitate communications between BMS controller 366 and external applications (e.g., monitoring and reporting applications 422, enterprise control applications 426, remote systems and applications 444, applications residing on client devices 448, etc.) for allowing user control, monitoring, and adjustment to BMS controller 366 and/or subsystems 428. Interface 407 may also facilitate communications between BMS controller 366 and client devices 448. BMS interface 409 may facilitate communications between BMS controller 366 and building subsystems 428 (e.g., HVAC, lighting security, lifts, power distribution, business, etc.).

Interfaces 407, 409 can be or include wired or wireless communications interfaces (e.g., jacks, antennas, transmitters, receivers, transceivers, wire terminals, etc.) for conducting data communications with building subsystems 428 or other external systems or devices. In various embodiments, communications via interfaces 407, 409 can be direct (e.g., local wired or wireless communications) or via a communications network 446 (e.g., a WAN, the Internet, a cellular network, etc.). For example, interfaces 407, 409 can include an Ethernet card and port for sending and receiving data via an Ethernet-based communications link or network. In another example, interfaces 407, 409 can include a Wi-Fi transceiver for communicating via a wireless communications network. In another example, one or both of interfaces 407, 409 can include cellular or mobile phone communications transceivers. In one embodiment, communications interface 407 is a power line communications interface and BMS interface 409 is an Ethernet interface. In other embodiments, both communications interface 407 and BMS interface 409 are Ethernet interfaces or are the same Ethernet interface.

Still referring to FIG. 4, BMS controller 366 is shown to include a processing circuit 404 including a processor 406 and memory 408. Processing circuit 404 can be communicably connected to BMS interface 409 and/or communications interface 407 such that processing circuit 404 and the various components thereof can send and receive data via interfaces 407, 409. Processor 406 can be implemented as a general purpose processor, an application specific integrated circuit (ASIC), one or more field programmable gate arrays (FPGAs), a group of processing components, or other suitable electronic processing components.

Memory 408 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. Memory 408 can be or include volatile memory or non-volatile memory. Memory 408 can include database components, object code components, script components, or any other type of information structure for supporting the various activities and information structures described in the present application. According to some embodiments, memory 408 is communicably connected to processor 406 via processing circuit 404 and includes computer code for executing (e.g., by processing circuit 404 and/or processor 406) one or more processes described herein.

In some embodiments, BMS controller 366 is implemented within a single computer (e.g., one server, one housing, etc.). In various other embodiments BMS controller 366 can be distributed across multiple servers or computers (e.g., that can exist in distributed locations). Further, while FIG. 4 shows applications 422 and 426 as existing outside of BMS controller 366, in some embodiments, applications 422 and 426 can be hosted within BMS controller 366 (e.g., within memory 408).

Still referring to FIG. 4, memory 408 is shown to include an enterprise integration layer 410, an automated measurement and validation (AM&V) layer 412, a demand response (DR) layer 414, a fault detection and diagnostics (FDD) layer 416, an integrated control layer 418, and a building subsystem integration later 420. Layers 410-420 can be configured to receive inputs from building subsystems 428 and other data sources, determine optimal control actions for building subsystems 428 based on the inputs, generate control signals based on the optimal control actions, and provide the generated control signals to building subsystems 428. The following paragraphs describe some of the general functions performed by each of layers 410-420 in BMS 400.

Enterprise integration layer 410 can be configured to serve clients or local applications with information and services to support a variety of enterprise-level applications. For example, enterprise control applications 426 can be configured to provide subsystem-spanning control to a graphical user interface (GUI) or to any number of enterprise-level business applications (e.g., accounting systems, user identification systems, etc.). Enterprise control applications 426 may also or alternatively be configured to provide configuration GUIs for configuring BMS controller 366. In yet other embodiments, enterprise control applications 426 can work with layers 410-420 to optimize building performance (e.g., efficiency, energy use, comfort, or safety) based on inputs received at interface 407 and/or BMS interface 409.

Building subsystem integration layer 420 can be configured to manage communications between BMS controller 366 and building subsystems 428. For example, building subsystem integration layer 420 may receive sensor data and input signals from building subsystems 428 and provide output data and control signals to building subsystems 428. Building subsystem integration layer 420 may also be configured to manage communications between building subsystems 428. Building subsystem integration layer 420 translate communications (e.g., sensor data, input signals, output signals, etc.) across a plurality of multi-vendor/multi-protocol systems.

Demand response layer 414 can be configured to optimize resource usage (e.g., electricity use, natural gas use, water use, etc.) and/or the monetary cost of such resource usage in response to satisfy the demand of building 10. The optimization can be based on time-of-use prices, curtailment signals, energy availability, or other data received from utility providers, distributed energy generation systems 424, from energy storage 427 (e.g., hot TES 242, cold TES 244, etc.), or from other sources. Demand response layer 414 may receive inputs from other layers of BMS controller 366 (e.g., building subsystem integration layer 420, integrated control layer 418, etc.). The inputs received from other layers can include environmental or sensor inputs such as temperature, carbon dioxide levels, relative humidity levels, air quality sensor outputs, occupancy sensor outputs, room schedules, and the like. The inputs may also include inputs such as electrical use (e.g., expressed in kWh), thermal load measurements, pricing information, projected pricing, smoothed pricing, curtailment signals from utilities, and the like.

According to some embodiments, demand response layer 414 includes control logic for responding to the data and signals it receives. These responses can include communicating with the control algorithms in integrated control layer 418, changing control strategies, changing setpoints, or activating/deactivating building equipment or subsystems in a controlled manner. Demand response layer 414 may also include control logic configured to determine when to utilize stored energy. For example, demand response layer 414 may determine to begin using energy from energy storage 427 just prior to the beginning of a peak use hour.

In some embodiments, demand response layer 414 includes a control module configured to actively initiate control actions (e.g., automatically changing setpoints) which minimize energy costs based on one or more inputs representative of or based on demand (e.g., price, a curtailment signal, a demand level, etc.). In some embodiments, demand response layer 414 uses equipment models to determine an optimal set of control actions. The equipment models can include, for example, thermodynamic models describing the inputs, outputs, and/or functions performed by various sets of building equipment. Equipment models may represent collections of building equipment (e.g., subplants, chiller arrays, etc.) or individual devices (e.g., individual chillers, heaters, pumps, etc.).

Demand response layer 414 may further include or draw upon one or more demand response policy definitions (e.g., databases, XML files, etc.). The policy definitions can be edited or adjusted by a user (e.g., via a graphical user interface) so that the control actions initiated in response to demand inputs can be tailored for the user's application, desired comfort level, particular building equipment, or based on other concerns. For example, the demand response policy definitions can specify which equipment can be turned on or off in response to particular demand inputs, how long a system or piece of equipment should be turned off, what setpoints can be changed, what the allowable set point adjustment range is, how long to hold a high demand setpoint before returning to a normally scheduled setpoint, how close to approach capacity limits, which equipment modes to utilize, the energy transfer rates (e.g., the maximum rate, an alarm rate, other rate boundary information, etc.) into and out of energy storage devices (e.g., thermal storage tanks, battery banks, etc.), and when to dispatch on-site generation of energy (e.g., via fuel cells, a motor generator set, etc.).

Integrated control layer 418 can be configured to use the data input or output of building subsystem integration layer 420 and/or demand response later 414 to make control decisions. Due to the subsystem integration provided by building subsystem integration layer 420, integrated control layer 418 can integrate control activities of the subsystems 428 such that the subsystems 428 behave as a single integrated supersystem. In some embodiments, integrated control layer 418 includes control logic that uses inputs and outputs from a plurality of building subsystems to provide greater comfort and energy savings relative to the comfort and energy savings that separate subsystems could provide alone. For example, integrated control layer 418 can be configured to use an input from a first subsystem to make an energy-saving control decision for a second subsystem. Results of these decisions can be communicated back to building subsystem integration layer 420.

Integrated control layer 418 is shown to be logically below demand response layer 414. Integrated control layer 418 can be configured to enhance the effectiveness of demand response layer 414 by enabling building subsystems 428 and their respective control loops to be controlled in coordination with demand response layer 414. This configuration may advantageously reduce disruptive demand response behavior relative to conventional systems. For example, integrated control layer 418 can be configured to assure that a demand response-driven upward adjustment to the setpoint for chilled water temperature (or another component that directly or indirectly affects temperature) does not result in an increase in fan energy (or other energy used to cool a space) that would result in greater total building energy use than was saved at the chiller.

Integrated control layer 418 can be configured to provide feedback to demand response layer 414 so that demand response layer 414 checks that constraints (e.g., temperature, lighting levels, etc.) are properly maintained even while demanded load shedding is in progress. The constraints may also include setpoint or sensed boundaries relating to safety, equipment operating limits and performance, comfort, fire codes, electrical codes, energy codes, and the like. Integrated control layer 418 is also logically below fault detection and diagnostics layer 416 and automated measurement and validation layer 412. Integrated control layer 418 can be configured to provide calculated inputs (e.g., aggregations) to these higher levels based on outputs from more than one building subsystem.

Automated measurement and validation (AM&V) layer 412 can be configured to verify that control strategies commanded by integrated control layer 418 or demand response layer 414 are working properly (e.g., using data aggregated by AM&V layer 412, integrated control layer 418, building subsystem integration layer 420, FDD layer 416, or otherwise). The calculations made by AM&V layer 412 can be based on building system energy models and/or equipment models for individual BMS devices or subsystems. For example, AM&V layer 412 may compare a model-predicted output with an actual output from building subsystems 428 to determine an accuracy of the model.

Fault detection and diagnostics (FDD) layer 416 can be configured to provide on-going fault detection for building subsystems 428, building subsystem devices (i.e., building equipment), and control algorithms used by demand response layer 414 and integrated control layer 418. FDD layer 416 may receive data inputs from integrated control layer 418, directly from one or more building subsystems or devices, or from another data source. FDD layer 416 may automatically diagnose and respond to detected faults. The responses to detected or diagnosed faults can include providing an alert message to a user, a maintenance scheduling system, or a control algorithm configured to attempt to repair the fault or to work-around the fault.

FDD layer 416 can be configured to output a specific identification of the faulty component or cause of the fault (e.g., loose damper linkage) using detailed subsystem inputs available at building subsystem integration layer 420. In other exemplary embodiments, FDD layer 416 is configured to provide "fault" events to integrated control layer 418 which executes control strategies and policies in response to the received fault events. According to some embodiments, FDD layer 416 (or a policy executed by an integrated control engine or business rules engine) may shut-down systems or direct control activities around faulty devices or systems to reduce energy waste, extend equipment life, or assure proper control response.

FDD layer 416 can be configured to store or access a variety of different system data stores (or data points for live data). FDD layer 416 may use some content of the data stores to identify faults at the equipment level (e.g., specific chiller, specific AHU, specific terminal unit, etc.) and other content to identify faults at component or subsystem levels. For example, building subsystems 428 may generate temporal (i.e., time-series) data indicating the performance of BMS 400 and the various components thereof. The data generated by building subsystems 428 can include measured or calculated values that exhibit statistical characteristics and provide information about how the corresponding system or process (e.g., a temperature control process, a flow control process, etc.) is performing in terms of error from its setpoint. These processes can be examined by FDD layer 416 to expose when the system begins to degrade in performance and alert a user to repair the fault before it becomes more severe.

Referring now to FIG. 5, a block diagram of another building management system (BMS) 500 is shown, according to some embodiments. BMS 500 can be used to monitor and control the devices of HVAC system 100, waterside system 200, airside system 300, building subsystems 428, as well as other types of BMS devices (e.g., lighting equipment, security equipment, etc.) and/or HVAC equipment.

BMS 500 provides a system architecture that facilitates automatic equipment discovery and equipment model distribution. Equipment discovery can occur on multiple levels of BMS 500 across multiple different communications busses (e.g., a system bus 554, zone buses 556-560 and 564, sensor/actuator bus 566, etc.) and across multiple different communications protocols. In some embodiments, equipment discovery is accomplished using active node tables, which provide status information for devices connected to each communications bus. For example, each communications bus can be monitored for new devices by monitoring the corresponding active node table for new nodes. When a new device is detected, BMS 500 can begin interacting with the new device (e.g., sending control signals, using data from the device) without user interaction.

Some devices in BMS 500 present themselves to the network using equipment models. An equipment model defines equipment object attributes, view definitions, schedules, trends, and the associated BACnet value objects (e.g., analog value, binary value, multistate value, etc.) that are used for integration with other systems. Some devices in BMS 500 store their own equipment models. Other devices in BMS 500 have equipment models stored externally (e.g., within other devices). For example, a zone coordinator 508 can store the equipment model for a bypass damper 528. In some embodiments, zone coordinator 508 automatically creates the equipment model for bypass damper 528 or other devices on zone bus 558. Other zone coordinators can also create equipment models for devices connected to their zone busses. The equipment model for a device can be created automatically based on the types of data points exposed by the device on the zone bus, device type, and/or other device attributes. Several examples of automatic equipment discovery and equipment model distribution are discussed in greater detail below.

Still referring to FIG. 5, BMS 500 is shown to include a system manager 502; several zone coordinators 506, 508, 510 and 518; and several zone controllers 524, 530, 532, 536, 548, and 550. System manager 502 can monitor data points in BMS 500 and report monitored variables to various monitoring and/or control applications. System manager 502 can communicate with client devices 504 (e.g., user devices, desktop computers, laptop computers, mobile devices, etc.) via a data communications link 574 (e.g., BACnet IP, Ethernet, wired or wireless communications, etc.). System manager 502 can provide a user interface to client devices 504 via data communications link 574. The user interface may allow users to monitor and/or control BMS 500 via client devices 504.

In some embodiments, system manager 502 is connected with zone coordinators 506-510 and 518 via a system bus 554. System manager 502 can be configured to communicate with zone coordinators 506-510 and 518 via system bus 554 using a master-slave token passing (MSTP) protocol or any other communications protocol. System bus 554 can also connect system manager 502 with other devices such as a constant volume (CV) rooftop unit (RTU) 512, an input/output module (IOM) 514, a thermostat controller 516 (e.g., a TEC5000 series thermostat controller), and a network automation engine (NAE) or third-party controller 520. RTU 512 can be configured to communicate directly with system manager 502 and can be connected directly to system bus 554. Other RTUs can communicate with system manager 502 via an intermediate device. For example, a wired input 562 can connect a third-party RTU 542 to thermostat controller 516, which connects to system bus 554.

System manager 502 can provide a user interface for any device containing an equipment model. Devices such as zone coordinators 506-510 and 518 and thermostat controller 516 can provide their equipment models to system manager 502 via system bus 554. In some embodiments, system manager 502 automatically creates equipment models for connected devices that do not contain an equipment model (e.g., IOM 514, third party controller 520, etc.). For example, system manager 502 can create an equipment model for any device that responds to a device tree request. The equipment models created by system manager 502 can be stored within system manager 502. System manager 502 can then provide a user interface for devices that do not contain their own equipment models using the equipment models created by system manager 502. In some embodiments, system manager 502 stores a view definition for each type of equipment connected via system bus 554 and uses the stored view definition to generate a user interface for the equipment.

Each zone coordinator 506-510 and 518 can be connected with one or more of zone controllers 524, 530-532, 536, and 548-550 via zone buses 556, 558, 560, and 564. Zone coordinators 506-510 and 518 can communicate with zone controllers 524, 530-532, 536, and 548-550 via zone busses 556-560 and 564 using a MSTP protocol or any other communications protocol. Zone busses 556-560 and 564 can also connect zone coordinators 506-510 and 518 with other types of devices such as variable air volume (VAV) RTUs 522 and 540, changeover bypass (COBP) RTUs 526 and 552, bypass dampers 528 and 546, and PEAK controllers 534 and 544.

Zone coordinators 506-510 and 518 can be configured to monitor and command various zoning systems. In some embodiments, each zone coordinator 506-510 and 518 monitors and commands a separate zoning system and is connected to the zoning system via a separate zone bus. For example, zone coordinator 506 can be connected to VAV RTU 522 and zone controller 524 via zone bus 556. Zone coordinator 508 can be connected to COBP RTU 526, bypass damper 528, COBP zone controller 530, and VAV zone controller 532 via zone bus 558. Zone coordinator 510 can be connected to PEAK controller 534 and VAV zone controller 536 via zone bus 560. Zone coordinator 518 can be connected to PEAK controller 544, bypass damper 546, COBP zone controller 548, and VAV zone controller 550 via zone bus 564.

A single model of zone coordinator 506-510 and 518 can be configured to handle multiple different types of zoning systems (e.g., a VAV zoning system, a COBP zoning system, etc.). Each zoning system can include a RTU, one or more zone controllers, and/or a bypass damper. For example, zone coordinators 506 and 510 are shown as Verasys VAV engines (VVEs) connected to VAV RTUs 522 and 540, respectively. Zone coordinator 506 is connected directly to VAV RTU 522 via zone bus 556, whereas zone coordinator 510 is connected to a third-party VAV RTU 540 via a wired input 568 provided to PEAK controller 534. Zone coordinators 508 and 518 are shown as Verasys COBP engines (VCEs) connected to COBP RTUs 526 and 552, respectively. Zone coordinator 508 is connected directly to COBP RTU 526 via zone bus 558, whereas zone coordinator 518 is connected to a third-party COBP RTU 552 via a wired input 570 provided to PEAK controller 544.

Zone controllers 524, 530-532, 536, and 548-550 can communicate with individual BMS devices (e.g., sensors, actuators, etc.) via sensor/actuator (SA) busses. For example, VAV zone controller 536 is shown connected to networked sensors 538 via SA bus 566. Zone controller 536 can communicate with networked sensors 538 using a MSTP protocol or any other communications protocol. Although only one SA bus 566 is shown in FIG. 5, it should be understood that each zone controller 524, 530-532, 536, and 548-550 can be connected to a different SA bus. Each SA bus can connect a zone controller with various sensors (e.g., temperature sensors, humidity sensors, pressure sensors, light sensors, occupancy sensors, etc.), actuators (e.g., damper actuators, valve actuators, etc.) and/or other types of controllable equipment (e.g., chillers, heaters, fans, pumps, etc.).

Each zone controller 524, 530-532, 536, and 548-550 can be configured to monitor and control a different building zone. Zone controllers 524, 530-532, 536, and 548-550 can use the inputs and outputs provided via their SA busses to monitor and control various building zones. For example, a zone controller 536 can use a temperature input received from networked sensors 538 via SA bus 566 (e.g., a measured temperature of a building zone) as feedback in a temperature control algorithm. Zone controllers 524, 530-532, 536, and 548-550 can use various types of control algorithms (e.g., state-based algorithms, extremum seeking control (ESC) algorithms, proportional-integral (PI) control algorithms, proportional-integral-derivative (PID) control algorithms, model predictive control (MPC) algorithms, feedback control algorithms, etc.) to control a variable state or condition (e.g., temperature, humidity, airflow, lighting, etc.) in or around building 10.

Variable Refrigerant Flow Systems

Figure 6:
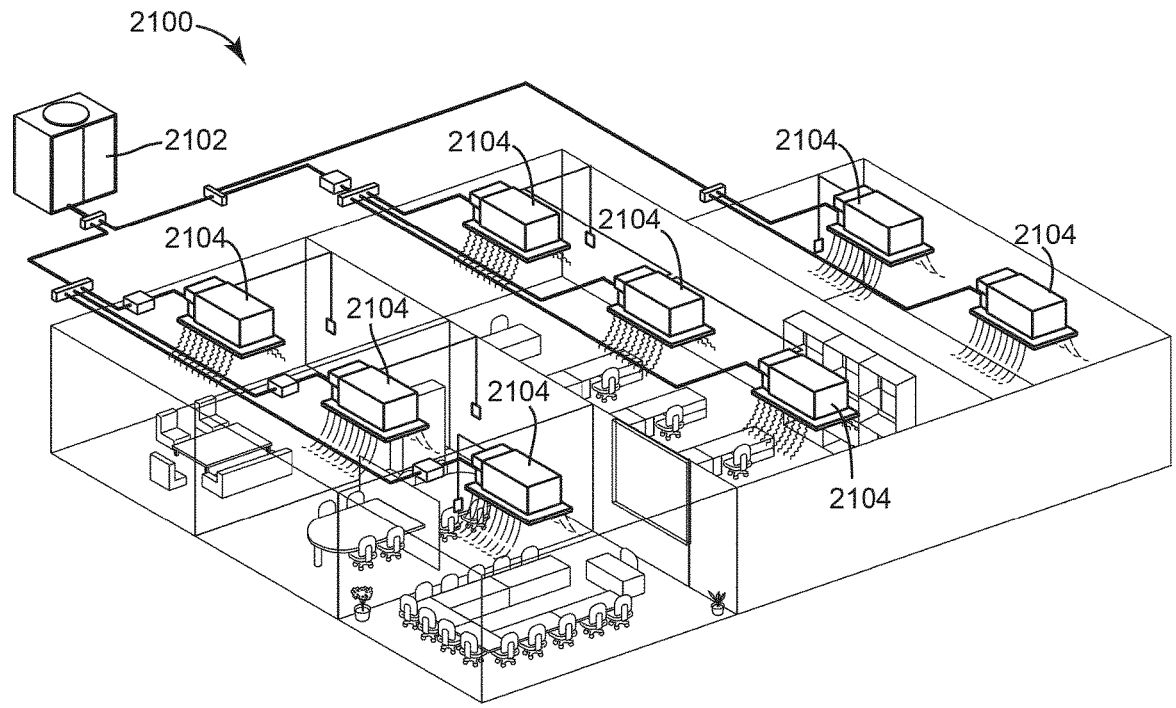
FIG. 6 is a diagram of a building served by a variable refrigerant flow system, according to an exemplary embodiment.
Figure 7:
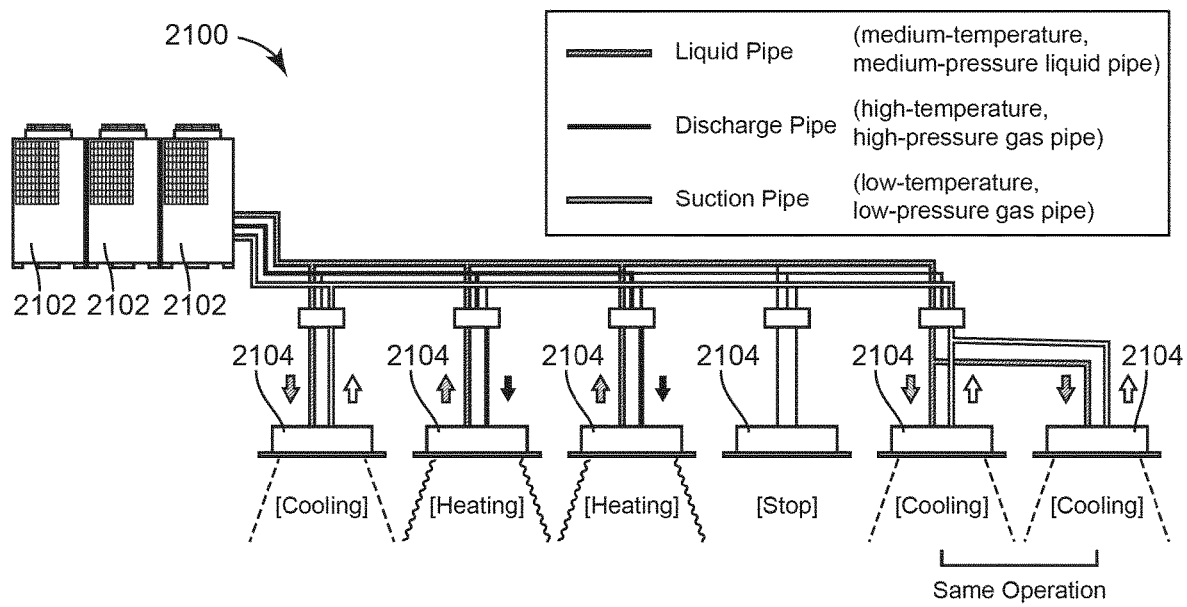
FIG. 7 is a diagram of the variable refrigerant flow system of FIG. 6, according to an exemplary embodiment.

Referring now to FIGS. 6-7, a variable refrigerant flow (VRF) system 2100 is shown, according to some embodiments. VRF system 2100 is shown to include one or more outdoor VRF units 2102 and a plurality of indoor VRF units 2104. Outdoor VRF units 2102 can be located outside a building and can operate to heat or cool a refrigerant. Outdoor VRF units 2102 can consume electricity to convert refrigerant between liquid, gas, and/or super-heated gas phases. Indoor VRF units 2104 can be distributed throughout various building zones within a building and can receive the heated or cooled refrigerant from outdoor VRF units 2102. Each indoor VRF unit 2104 can provide temperature control for the particular building zone in which the indoor VRF unit 2104 is located. Although the term "indoor" is used to denote that the indoor VRF units 2104 are typically located inside of buildings, in some cases one or more indoor VRF units are located "outdoors" (i.e., outside of a building) for example to heat/cool a patio, entryway, walkway, etc.

One advantage of VRF system 2100 is that some indoor VRF units 2104 can operate in a cooling mode while other indoor VRF units 2104 operate in a heating mode. For example, each of outdoor VRF units 2102 and indoor VRF units 2104 can operate in a heating mode, a cooling mode, or an off mode. Each building zone can be controlled independently and can have different temperature setpoints. In some embodiments, each building has up to three outdoor VRF units 2102 located outside the building (e.g., on a rooftop) and up to 128 indoor VRF units 2104 distributed throughout the building (e.g., in various building zones). Building zones may include, among other possibilities, apartment units, offices, retail spaces, and common areas. In some cases, various building zones are owned, leased, or otherwise occupied by a variety of tenants, all served by the VRF system 2100.

Many different configurations exist for VRF system 2100. In some embodiments, VRF system 2100 is a two-pipe system in which each outdoor VRF unit 2102 connects to a single refrigerant return line and a single refrigerant outlet line. In a two-pipe system, all of outdoor VRF units 2102 may operate in the same mode since only one of a heated or chilled refrigerant can be provided via the single refrigerant outlet line. In other embodiments, VRF system 2100 is a three-pipe system in which each outdoor VRF unit 2102 connects to a refrigerant return line, a hot refrigerant outlet line, and a cold refrigerant outlet line. In a three-pipe system, both heating and cooling can be provided simultaneously via the dual refrigerant outlet lines. An example of a three-pipe VRF system is described in detail with reference to FIG. 8.

Figure 8:
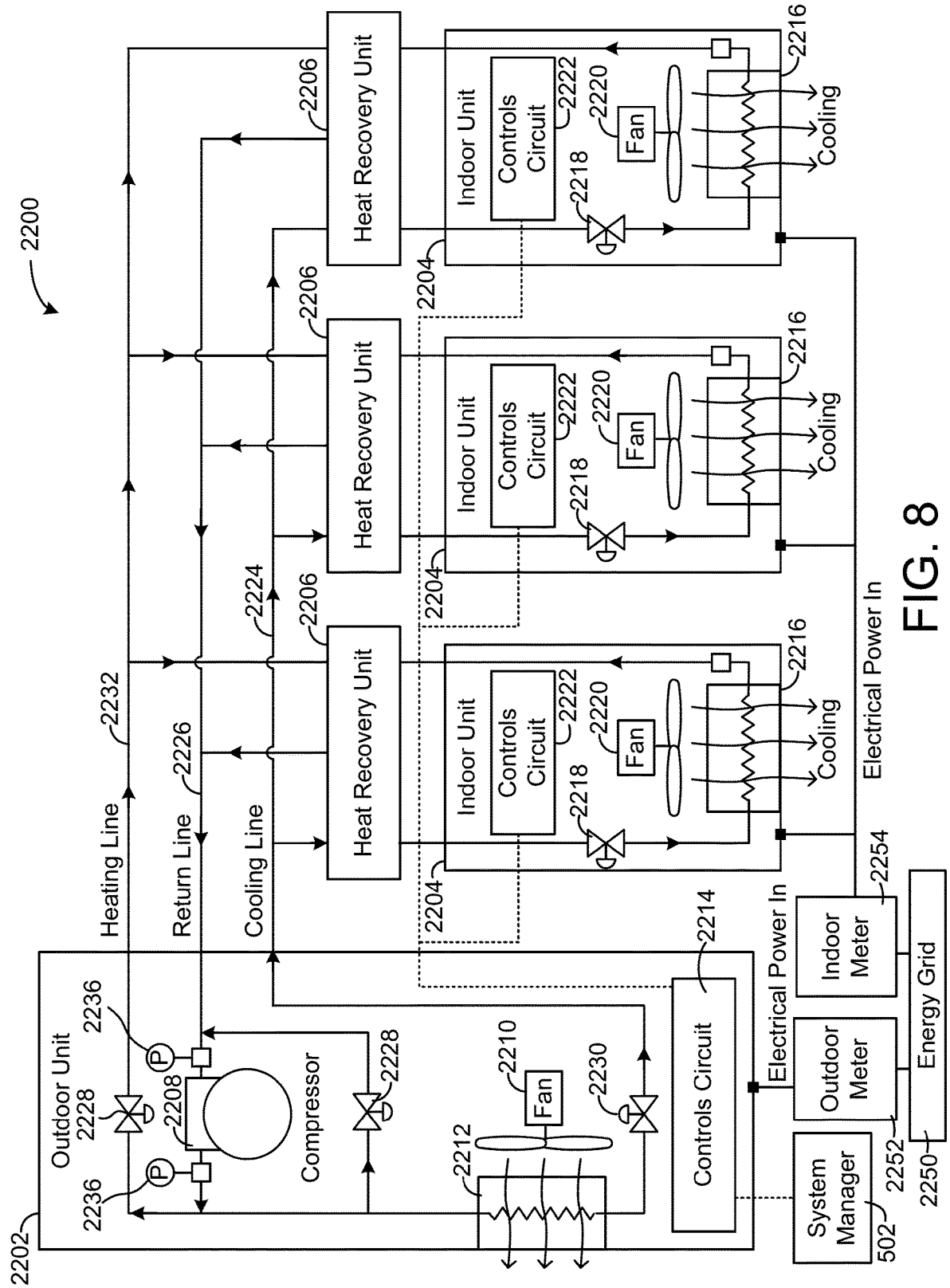
FIG. 8 is a detailed diagram of a variable refrigerant flow system, according to an exemplary embodiment.

Referring now to FIG. 8, a block diagram illustrating a VRF system 2200 is shown, according to some embodiments. VRF system 2200 is shown to include outdoor VRF unit 202, several heat recovery units 2206, and several indoor VRF units 2204. Outdoor VRF unit 202 may include a compressor 2208, a fan 2210, or other power-consuming refrigeration components configured convert a refrigerant between liquid, gas, and/or super-heated gas phases. Indoor VRF units 2204 can be distributed throughout various building zones within a building and can receive the heated or cooled refrigerant from outdoor VRF unit 202. Each indoor VRF unit 2204 can provide temperature control for the particular building zone in which the indoor VRF unit 2204 is located. Heat recovery units 2206 can control the flow of a refrigerant between outdoor VRF unit 202 and indoor VRF units 2204 (e.g., by opening or closing valves) and can minimize the heating or cooling load to be served by outdoor VRF unit 202.

Outdoor VRF unit 202 is shown to include a compressor 2208 and a heat exchanger 2212. Compressor 2208 circulates a refrigerant between heat exchanger 2212 and indoor VRF units 2204. The compressor 2208 operates at a variable frequency as controlled by outdoor unit controls circuit 214. At higher frequencies, the compressor 2208 provides the indoor VRF units 2204 with greater heat transfer capacity. Electrical power consumption of compressor 2208 increases proportionally with compressor frequency.

Heat exchanger 2212 can function as a condenser (allowing the refrigerant to reject heat to the outside air) when VRF system 2200 operates in a cooling mode or as an evaporator (allowing the refrigerant to absorb heat from the outside air) when VRF system 2200 operates in a heating mode. Fan 2210 provides airflow through heat exchanger 2212. The speed of fan 2210 can be adjusted (e.g., by outdoor unit controls circuit 214) to modulate the rate of heat transfer into or out of the refrigerant in heat exchanger 2212.

Each indoor VRF unit 2204 is shown to include a heat exchanger 2216 and an expansion valve 2218. Each of heat exchangers 2216 can function as a condenser (allowing the refrigerant to reject heat to the air within the room or zone) when the indoor VRF unit 2204 operates in a heating mode or as an evaporator (allowing the refrigerant to absorb heat from the air within the room or zone) when the indoor VRF unit 2204 operates in a cooling mode. Fans 2220 provide airflow through heat exchangers 2216. The speeds of fans 2220 can be adjusted (e.g., by indoor unit controls circuits 2222) to modulate the rate of heat transfer into or out of the refrigerant in heat exchangers 2216.

In FIG. 8, indoor VRF units 2204 are shown operating in the cooling mode. In the cooling mode, the refrigerant is provided to indoor VRF units 2204 via cooling line 22224. The refrigerant is expanded by expansion valves 2218 to a cold, low pressure state and flows through heat exchangers 2216 (functioning as evaporators) to absorb heat from the room or zone within the building. The heated refrigerant then flows back to outdoor VRF unit 202 via return line 22226 and is compressed by compressor 2208 to a hot, high pressure state. The compressed refrigerant flows through heat exchanger 2212 (functioning as a condenser) and rejects heat to the outside air. The cooled refrigerant can then be provided back to indoor VRF units 2204 via cooling line 2224. In the cooling mode, flow control valves 2228 can be closed and expansion valve 230 can be completely open.

In the heating mode, the refrigerant is provided to indoor VRF units 2204 in a hot state via heating line 222302. The hot refrigerant flows through heat exchangers 2216 (functioning as condensers) and rejects heat to the air within the room or zone of the building. The refrigerant then flows back to outdoor VRF unit via cooling line 2224 (opposite the flow direction shown in FIG. 8). The refrigerant can be expanded by expansion valve 230 to a colder, lower pressure state. The expanded refrigerant flows through heat exchanger 2212 (functioning as an evaporator) and absorbs heat from the outside air. The heated refrigerant can be compressed by compressor 2208 and provided back to indoor VRF units 2204 via heating line 2302 in a hot, compressed state. In the heating mode, flow control valves 2228 can be completely open to allow the refrigerant from compressor 2208 to flow into heating line 2302.

As shown in FIG. 8, each indoor VRF unit 2204 includes an indoor unit controls circuit 2222. Indoor unit controls circuit 2222 controls the operation of components of the indoor VRF unit 2204, including the fan 2220 and the expansion valve 2218, in response to a building zone temperature setpoint or other request to provide heating/cooling to the building zone. For example, the indoor unit controls circuit 2222 can generate a signal to turn the fan 2220 on and off Indoor unit controls circuit 2222 also determines a heat transfer capacity required by the indoor VRF unit 2204 and a frequency of compressor 2208 that corresponds to that capacity. When the indoor unit controls circuit 2222 determines that the indoor VRF unit 2204 must provide heating or cooling of a certain capacity, the indoor unit controls circuit 2222 then generates and transmits a compressor frequency request to the outdoor unit controls circuit 214 including the compressor frequency corresponding to the required capacity.

Outdoor unit controls circuit 214 receives compressor frequency requests from one or more indoor unit controls circuits 2222 and aggregates the requests, for example by summing the compressor frequency requests into a compressor total frequency. In some embodiments, the compressor frequency has an upper limit, such that the compressor total frequency cannot exceed the upper limit. The outdoor unit controls circuit 214 supplies the compressor total frequency to the compressor, for example as an input frequency given to a DC inverter compressor motor of the compressor. The indoor unit controls circuits 2222 and the outdoor unit controls circuit 214 thereby combine to modulate the compressor frequency to match heating/cooling demand. The outdoor unit controls circuit 214 may also generate signals to control valve positions of the flow control valves 2228 and expansion valve 230, a compressor power setpoint, a refrigerant flow setpoint, a refrigerant pressure setpoint (e.g., a differential pressure setpoint for the pressure measured by pressure sensors 2306), on/off commands, staging commands, or other signals that affect the operation of compressor 2208, as well as control signals provided to fan 2210 including a fan speed setpoint, a fan power setpoint, an airflow setpoint, on/off commands, or other signals that affect the operation of fan 2210.

Indoor unit controls circuits 2222 and outdoor unit controls circuit 214 may store and/or provide a data history of one or more control signals generated by or provided to the controls circuits 2214, 2222. For example, indoor unit controls circuits 2222 may store and/or provide a log of generated compressor request frequencies, fan on/off times, and indoor VRF unit 2204 on/off times. Outdoor unit controls circuit 214 may store and/or provide a log of compressor request frequencies and/or compressor total frequencies and compressor runtimes.

The VRF system 2200 is shown as running on electrical power provided by an energy grid 2250 via an outdoor meter 2252 and an indoor meter 2254. According to various embodiments, the energy grid 2250 is any supply of electricity, for example an electrical grid maintained by a utility company and supplied with power by one or more power plants. The outdoor meter 2252 measures the electrical power consumption over time of the outdoor VRF unit 202, for example in kilowatt-hours (kWh). The indoor meter 2254 measures the electrical power consumption over time of the indoor VRF units 2204, for example in kWh. The VRF system 2200 incurs energy consumption costs based on the metered electrical power consumption of the outdoor meter 2252 and/or the indoor meter 2254, as billed by the utility company that provides the electrical power. The price of electrical power (e.g., dollars per kWh) may vary over time.

The VRF system 2200 also includes a system manager 502. As described in detail above with reference to FIGS. 12-13, the system manager 502 is configured to minimize energy consumption costs for the VRF system 2200 while also maintaining occupant comfort.

Window Air Conditioner

Figure 9:
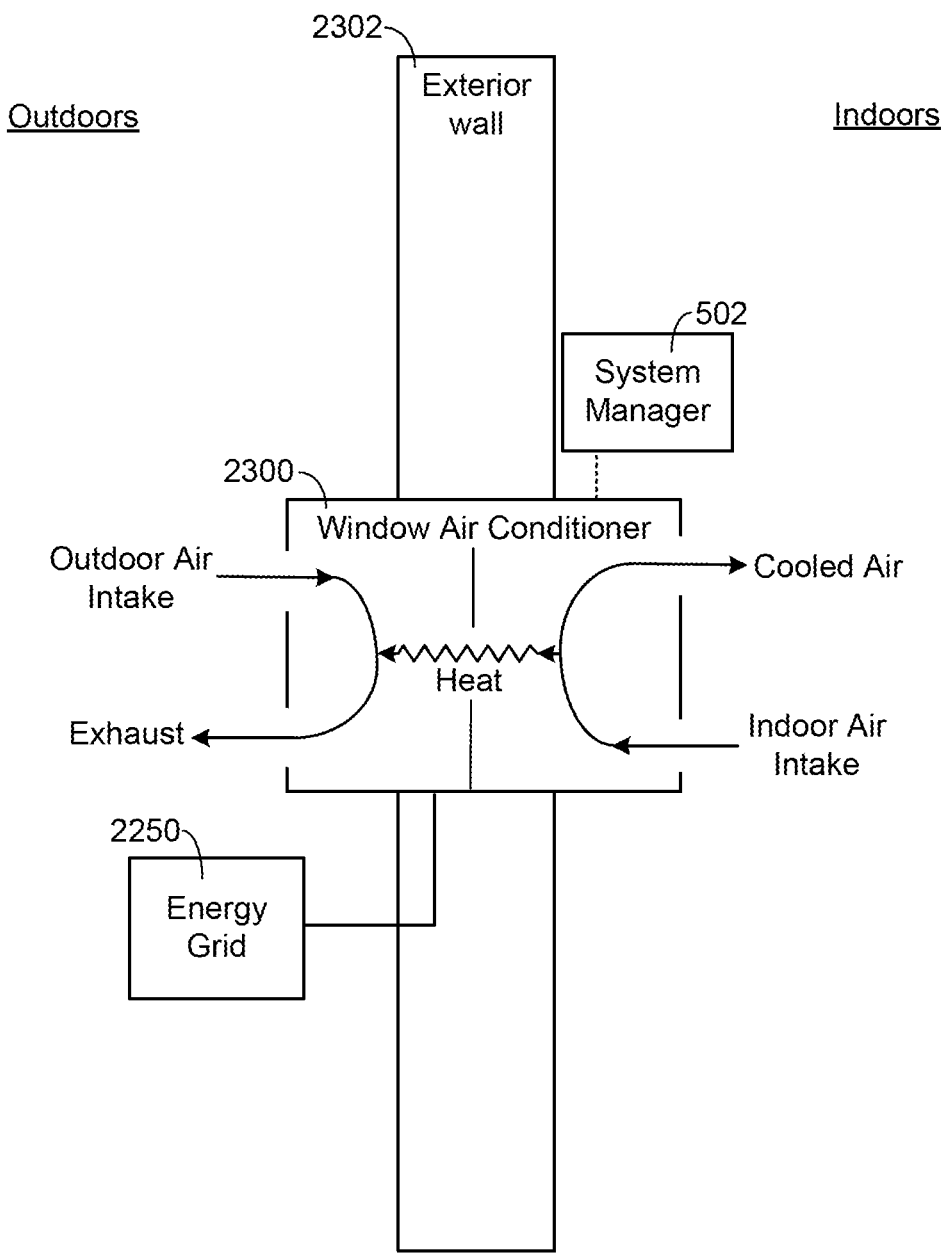
FIG. 9 is a block diagram of a window air conditioner, according to an exemplary embodiment.

Referring now to FIG. 9, a window air conditioner 2300 is shown, according to an exemplary embodiment. The window air conditioner 2300 is configured to be mounted in a window of a building, such that the window air conditioner 2300 extends across an exterior wall 2302 of the building. The window air conditioner 2300 can thereby provide airflow to and/or receive air from both indoors (i.e., inside a building) and outdoors (i.e., outside of a building). A window air conditioner 2300 is sometimes also referred to in the art as a room air conditioner.

The window air conditioner 2300 acts as a heat pump to transfer heat from the indoor air to the outdoor air. As shown in FIG. 9, the window air conditioner 2300 intakes indoor air and outputs cooled air into the room. The window air conditioner 2300 also intakes outdoor air and outputs exhaust outside of the building. The window air conditioner 2300 may include a compressor, a condenser, an evaporator, and one or more fans to facilitate the transfer of heat across the exterior wall 2302 (i.e., from indoors to outdoors). The window air conditioner 2300 is thereby configured to cause the temperature of the indoor air to decrease towards a temperature setpoint.

The window air conditioner 2300 consumes electrical power from the energy grid 2250 when operating to transfer heat across the exterior wall 2302. The window air conditioner 2300 may be controllable to operate at various powers to provide various levels of cooling to the building, for example based on a temperature setpoint. The window air conditioner 2300 may also turn on and off as needed. The window air conditioner 2300 therefore consumes more electrical power when providing more cooling and less electrical power when providing less cooling.

The system manager 502 is communicably coupled to the window air conditioner 2300 to provide control signals for the window air conditioner 2300 and to received data from the window air conditioner 2300. For example, the system manager 502 may provide a temperature setpoint to the window air conditioner 2300. The system manager 502 is described in detail with reference to FIGS. 12-13. In some embodiments, the system manager 502 is integrated into the window air conditioner 2300. In some embodiments, the system manager 502 operates remotely (e.g., on cloud server) and/or serves multiple window air conditioners 2300.

Room Air Conditioning System

Figure 10:
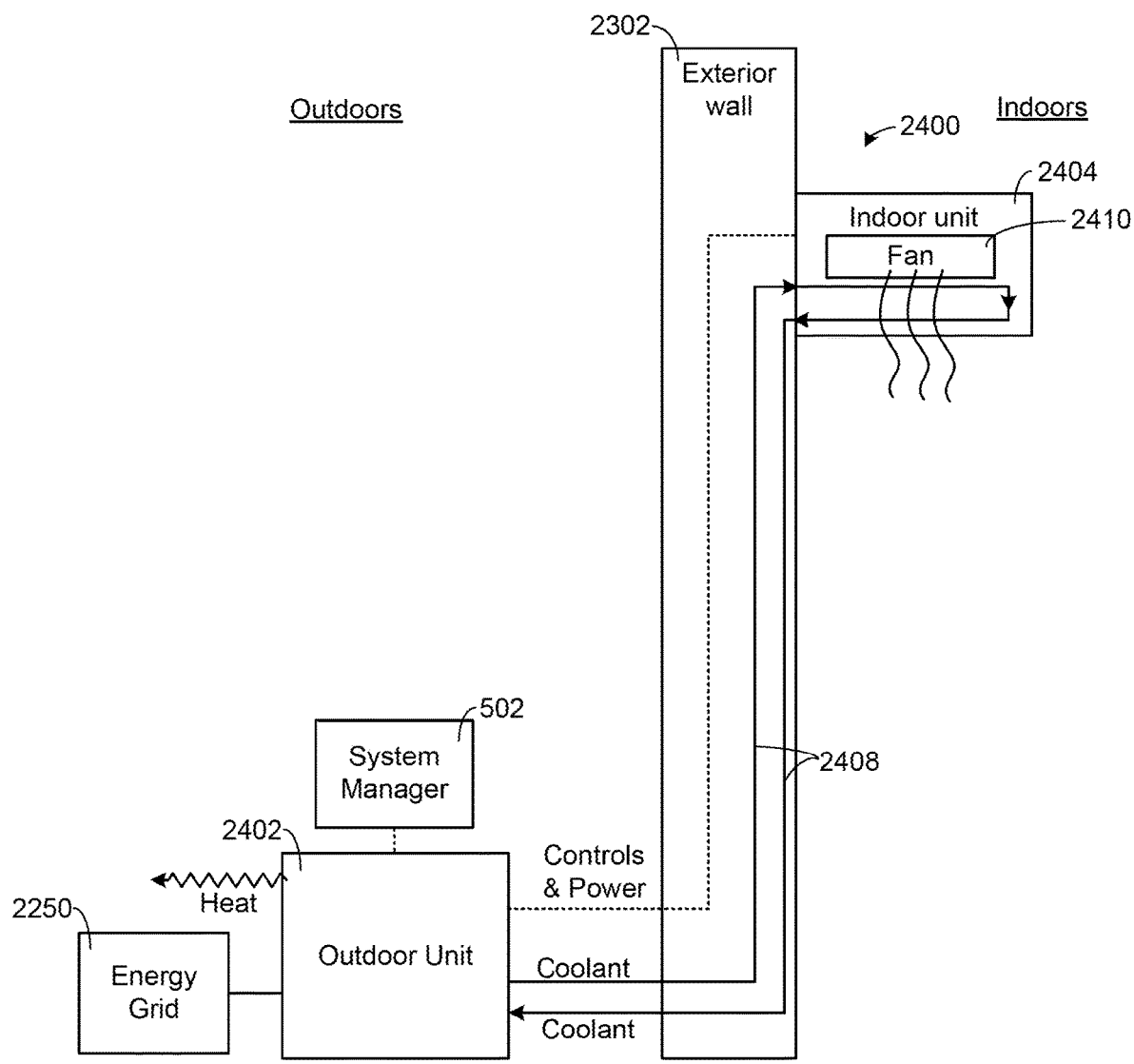
FIG. 10 is a block diagram of a room air conditioning system, according to an exemplary embodiment.

Referring now to FIG. 10, a room air conditioning system 2400 is shown, according to an exemplary embodiment. The room air conditioning system 2400 provides cooling for a room of a building. The room air conditioning system 2400 includes in outdoor unit 2402 and an indoor unit 2404. The outdoor unit 2402 is located outside of the building while the indoor unit 2404 is located inside of the building, such that the indoor unit 2404 is separated from the outdoor unit 2402 by an exterior wall 2302 of the building. The indoor unit 2404 may be mounted on an indoor surface of the exterior wall 2302. The indoor unit 2404 and the outdoor unit 2402 are communicably coupled to exchange control signals and data. The indoor unit 2404 may also receive electrical power via the outdoor unit 2402, or vice versa.

The outdoor unit 2402 consumes electrical power from the energy grid 2250 to cool a coolant. The coolant is then forced through pipe 2408, which runs through the exterior wall 406 from the outdoor unit 2402 to the indoor unit 2404. A fan 2410 blows air from the room across the pipe 2408 to transfer heat from the room to the coolant. The coolant then flows back to the outdoor unit 2402 where it is re-cooled for circulation back to the indoor unit 2404. The room air conditioning system 2400 thereby operates to transfer heat across the exterior wall 2302 from indoors to outdoors.

The outdoor unit 2402 and the indoor unit 2404 may be controlled to track a temperature setpoint for the room. For example, the outdoor unit 2402 may be controlled to run at various powers to provide variable rates of coolant flow and/or various coolant temperatures to the indoor unit 2404. The fan 2410 in the may be controlled to operate at various speeds. The room air conditioning system 2400 is also controllable to turn on and off as needed. Accordingly, the room air conditioning system 2400 consumes more electrical power from the energy grid 2250 when it provides more cooling to the room.

The system manager 502 is communicably coupled to the outdoor unit 2402 and/or the indoor unit 2404 to provide control signals for the room air conditioner system 2400 and to receive data from the room air conditioner system 2400. For example, the system manager 502 may provide a temperature setpoint to the room air conditioner system 2400. The system manager 502 is described in detail with reference to FIGS. 12-13. In some embodiments, the system manager 502 is integrated into the outdoor unit 2402 and/or the indoor unit 2404. In some embodiments, the system manager 502 operates remotely (e.g., on cloud server) and/or serves multiple room air conditioner systems 2400.

Packaged Air Conditioner

Figure 11:
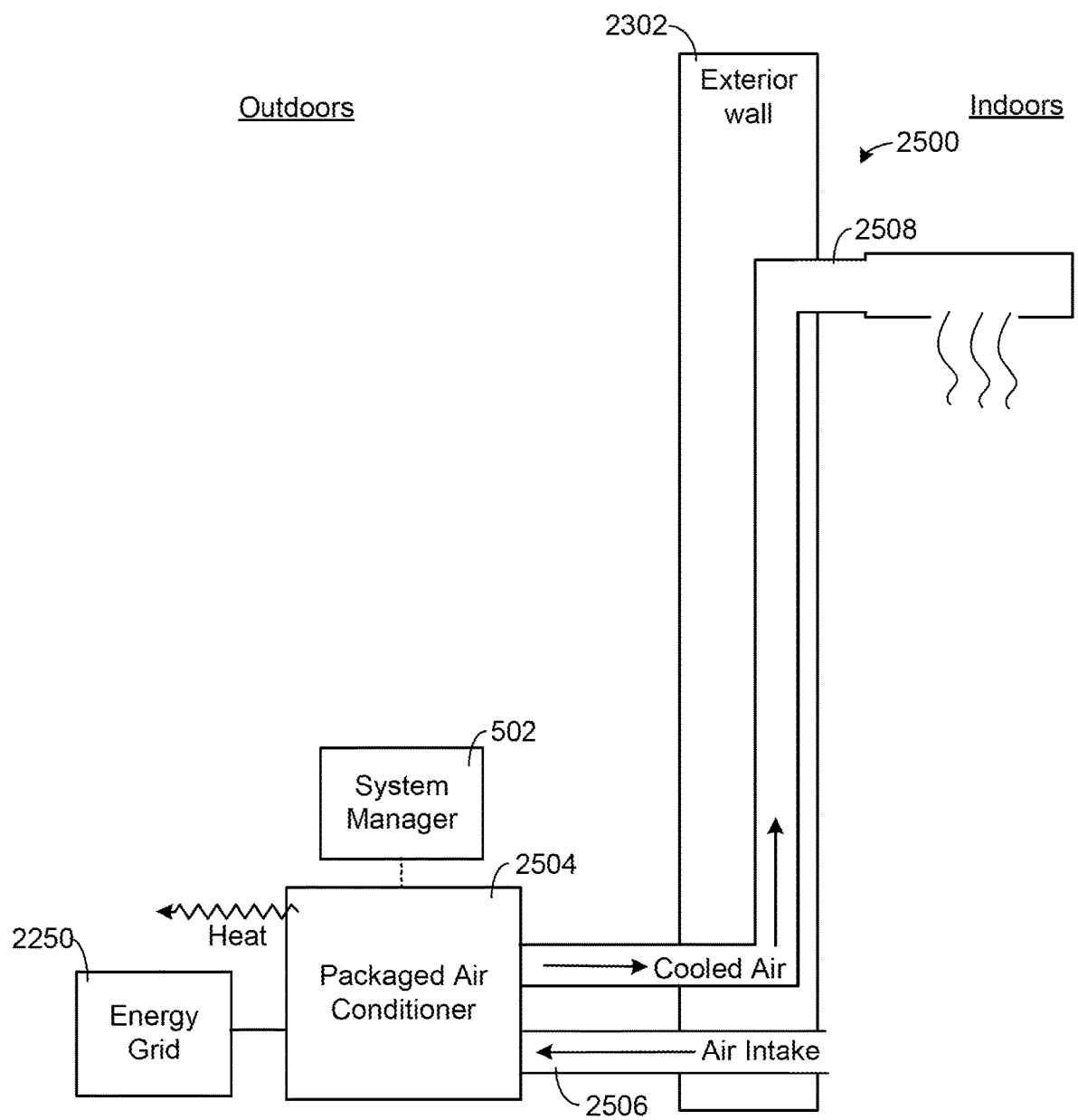
FIG. 11 is a block diagram of a packaged air conditioner system, according to an exemplary embodiment.

Referring now to FIG. 11, a packaged air conditioner system 2500 is shown, according to an exemplary embodiment. The packaged air conditioner system 2500 includes a packaged air conditioner 2504, an air intake vent 2506, and a cooled air duct 2508. The packaged air conditioner 2504 is located outdoors while the air intake vent 2506 and the cooled air duct 2508 extend from the packaged air conditioner 2504 through the exterior wall 2302 of a building to allow air to flow between the packaged air conditioner 2504 and the inside of the building.

The packaged air conditioner system 2500 consumes electrical power from energy grid 2250 to draw in indoor air from inside the building through the air intake vent 2506, remove heat from the indoor air to cool the air, and provide the cooled air to the cooled air duct 2508. The packaged air conditioner system 2500 expels the heat to the outdoor air. The cooled air duct 2508 allows the cooled air to flow across the exterior wall 2302 and into the air in the building to lower the indoor air temperature of the building.

The packaged air conditioner 2504 may be controlled to track a temperature setpoint for the building. For example, the packaged air conditioner 2504 may be operated at various powers to provide various temperatures of cooled air and/or various flow rates of cooled air to the cooled air duct 2508. The packaged air conditioner 2504 consumes more electrical power from the energy grid 2250 when it provides more cooling to the room, by operating at a higher rate of power consumption and/or by operating for more time.

The system manager 502 is communicably coupled to the packaged air conditioner 2504 to provide control signals for the room air conditioner system 2400 and to receive data from the packaged air conditioner 2504. For example, the system manager 502 may provide a temperature setpoint to the packaged air conditioner 2504. The system manager 502 is described in detail with reference to FIGS. 12-13. In some embodiments, the system manager 502 is integrated into the packaged air conditioner 2504. In some embodiments, the packaged air conditioner 2504 operates remotely (e.g., on cloud server) and/or serves multiple room air conditioner systems 2400.

System Manager with Neural Network

Figure 12:
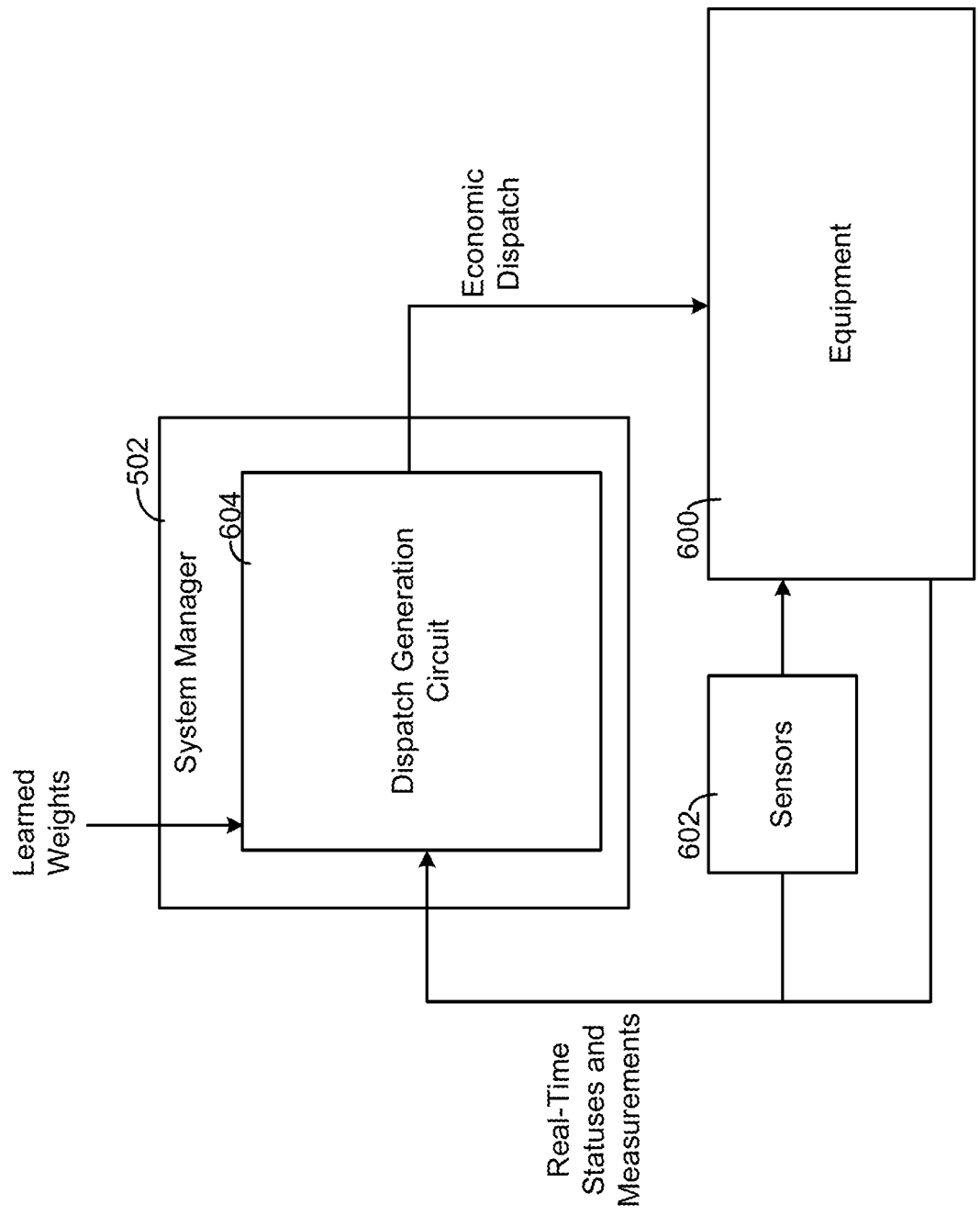
FIG. 12 is a block diagram of a system manager, according to an exemplary embodiment.

Referring now to FIG. 12, a block diagram of the system manager 502 is shown, according to an exemplary embodiment. FIG. 12 shows the system manager 502 communicably coupled to equipment 600 and sensors 602. According to various embodiments, equipment 600 includes the various HVAC equipment shown in FIGS. 1-5 (e.g., HVAC system 100, waterside system 200, airside system 300, and components thereof), VRF system 2100 of FIGS. 6-7, the VRF system 2200 of FIG. 8, the window air conditioner 2300 of FIG. 9, the room air conditioning system 400 of FIG. 10, and/or the packaged air conditioner system 2500 of FIG. 11. In some embodiments, the equipment 600 includes multiple window air conditioners 2300, room air conditioning systems 2400, and/or packaged air conditioner systems 2500. Equipment 600 is operable to affect one or more variable states or conditions of a room, building, or campus, for example air temperature inside a building. In cases where equipment 600 includes multiple devices of equipment, one or more of the devices of equipment may be offline at any given time. Equipment 600 may be configured to provide an offline or online status to the system manager 502.

Sensors 602 provide measurements that facilitate the operation of equipment 600 and system manager 502. Sensors 602 may include temperature sensors, humidity sensors, air speed sensors, occupancy counters, etc. Sensors 602 may measure the indoor air temperature of a building, outdoor air temperature outside of the building, humidity inside the building, humidity outside the building, the number of people in the building, etc. The sensors 602 collect this measurement data and provide the measurement data to the system manager 502. The sensors 602 may also provide measurement data to the equipment 600.

The system manager 502 is shown to include a dispatch generation circuit 604. The dispatch generation circuit 604 receives real-time measurements from the sensors 602 and equipment status information form the equipment 600 and processes the measurement and status data to generate an economic dispatch for the equipment 600. As used herein, economic dispatch (control dispatch) refers to any collection, set, or group of control inputs for equipment 600 (e.g., temperature setpoints, schedules, humidity setpoints, airflow setpoint, power level, on/off setting, damper positions, fan speeds, compressor frequency, resource consumption allocation).

The dispatch generation circuit 604 uses a neural network to associate measurements and equipment status information with an economic dispatch that minimizes utility costs while achieving occupant comfort. In the neural network, a network of artificial neurons are allowed to transmit a signal to neighboring neurons. When an artificial neuron receives a signal, the neuron processes that signal and then communicates an output to various neighboring neurons. The output of a neuron may be calculated as a function of the sum of its inputs. The strength of the signal transmitted between particular neurons may be affected by a set of learned weights for the neural network. The neurons combine to form a neural network that can be trained to transform input data into an output signal. In some embodiments, the neural network is a convolutional neural network, which uses layers and pooling to improve the efficiency. As described in detail below with reference to FIG. 13, the learned weights may be provided to the dispatch generation circuit 604 by an offline training system.

The neural network operated by the dispatch generation circuit 604 may be substantially more efficient and require less computing resources than traditional approaches to generating economic dispatch based on measurement and statuses. Thus, the dispatch generation circuit 604 may allow the system manager 502 to be deployed where sophisticated dispatching was previously too complex for real-time online control given available computing resources, for example with an HVAC system 100, waterside system 200, airside system 300, VRF system 2100, VRF system 2200, window air conditioner 2300, room air conditioning system, and/or the packaged air conditioner system 2500.

In contrast to conventional computing programs in which deterministic rules are defined by a user, neural networks are typically "trained" to make desired associations between input data and output signals. Training the neural network includes facilitating the neural network in learning a set of learned weights which cause the neural network to make the desired associations between input and output. Neural networks are typically trained using datasets of real-world training data (e.g., measured data) of the inputs and outputs of a system that the neural network is intended to model. However, in the context of providing heating and/or cooling to a building described herein, a robust set of training data may require months or years of data and may not cover all situations that may be faced by the building (e.g., extreme weather events, rare equipment breakdowns). Thus, conventional approaches to machine learning and neural networks may be ill-suited for use with the system manager 502 and equipment 600. However, as described in detail below with reference to FIG. 13, the present disclosure introduces systems and methods for model-driven deep learning for building equipment (e.g., equipment 600) to address these challenges.

Figure 13:
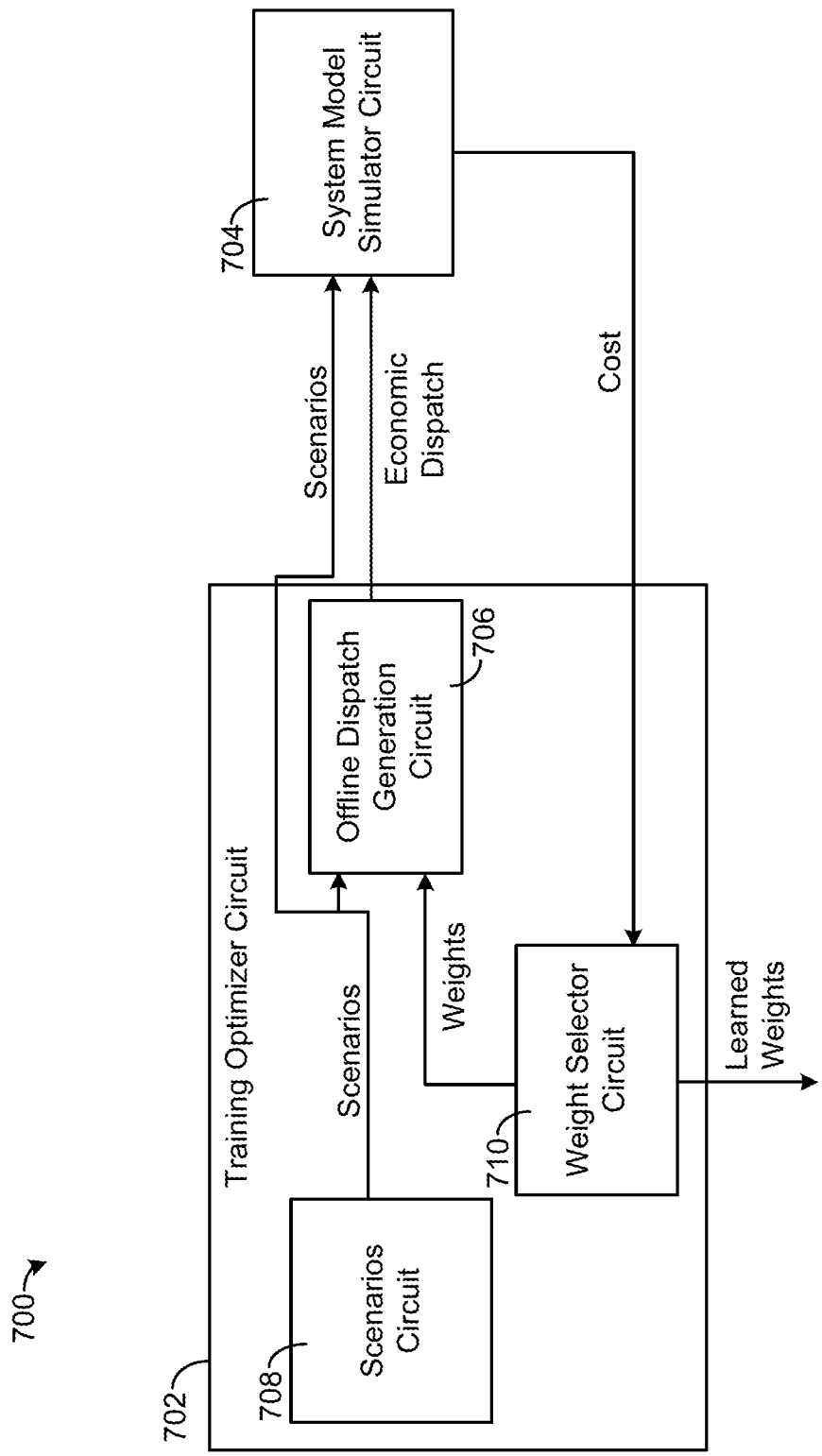
FIG. 13 is a block diagram of an offline training system, according to an exemplary embodiment.

Referring now to FIG. 13, an offline training system 700 is shown, according to an exemplary embodiment. The offline training system 700 is configured to execute a model-driven deep learning process to generate one or more sets of learned weights to provide to the dispatch generation circuit 604 for use in online control. The offline training system 700 includes a training optimizer circuit 702 and a system model simulator circuit 704.

The system model simulator circuit 704 is configured to run simulations of the system (i.e., of the equipment 600 and the building or campus served by the equipment 600) based on an economic dispatch (e.g., equipment setpoints and operating points) and a given scenario. Each scenario includes a set of simulated measurements (e.g., inside air temperature, outside air temperature) and equipment statuses (e.g., an indication of which equipment 600 is online or offline). The system model simulator circuit 704 applies the economic dispatch, simulated measurements, and equipment statuses to a system model. The system model may be the same or similar to one or more models used in model predictive control approaches to controlling building equipment. For example, the system model may be identified as described in "BUILDING MANAGEMENT SYSTEM WITH SYSTEM IDENTIFICATION USING MULTI-STEP AHEAD ERROR PREDICTION," U.S. patent application Ser. No. 15/953,324 filed Apr. 14, 2018, incorporated by reference herein in its entirety.

The system model simulator circuit 704 runs a simulation using the model for a time period to determine a cost over that time period. The cost may be defined by the power consumption of the equipment 600 over the time period, the utility price of resource consumption over the time period, various incentive-based demand respond programs, demand charges, and/or various other terms or variables in an economic cost function, for example as described in U.S. patent application Ser. No. 15/426,962, filed Feb. 7, 2017, the entire disclosure of which is incorporated by reference herein. For example, the cost may be determined by a cost function that includes a penalty function that incorporates occupant comfort into cost (e.g., by increasing the cost when the air temperature is outside of a comfortable temperature range). The term "cost" as used herein may refer to any such formulation. The system model simulator circuit 704 thereby receives an economic dispatch and a scenario from the training optimizer circuit 702 and returns a cost to the training optimizer circuit 702. In other words, the system model simulator circuit simulates how the building system would respond to the specified economic dispatch under the specified scenario and predicts the cost that would be incurred over a given time period.

The training optimizer circuit 702 is configured to determine learned weights which minimize cost for a variety of simulated measurements and a variety of equipment statuses, as described in detail below. The training optimizer circuit 702 produces learned weights for use by the dispatch generation circuit 604. The learned weights produced by the training optimizer circuit 702 may tune the neural network such that the economic dispatches generated by the dispatch generation circuit 604 control the equipment 600 to minimize cost. The training optimizer circuit 702 is communicable with the system model simulator circuit 704 and includes an offline dispatch generation circuit 706, a scenarios circuit 708, and a weight selector circuit 710.

The scenarios circuit 708 is configured to generate various scenarios and provide the scenarios to the offline dispatch generation circuit 706. The scenarios generated by the scenarios circuit 708 includes a value for each of the real-time statuses and measurements shown as inputs to the online dispatch generation circuit 604 in FIG. 13. For example, the scenarios may include values of indoor air temperature, outdoor air temperature, relative humidity, etc. as well as indications of equipment that may be offline. The scenarios circuit 708 thereby provides the offline dispatch generation circuit 706 with the same types of inputs that are provided to the dispatch generation circuit 604 for online control. The scenarios may also be provided to the system model simulator circuit 704. The scenarios circuit 708 may vary the scenarios (i.e., vary the statuses and values of the measurements) to provide the offline dispatch generation circuit 706 with a robust range of scenarios.

The weight selector circuit 710 is configured to vary the weights used by the offline dispatch generation circuit 706 and facilitate convergence to the learned weights. The weight selector circuit 710 receives costs from the system model simulator circuit 704 and uses the costs in selecting new weights to provide to the offline dispatch generation circuit 706. The weight selector circuit 710 may follow a gradient descent or stochastic gradient descent approach to determine the learned weights. In such a case, the learned weights correspond to a cost extremum (e.g., a minimum cost).

In some embodiments, a set of learned weights is determined for each set of equipment statuses. That is, for each combination of online equipment and offline equipment, the weight selector circuit 710 determines a corresponding set of learned weights (e.g., a different neural network model for each combination of online and offline equipment). In online control, the dispatch generation circuit 604 may determine the current set of equipment statuses and apply the corresponding set of learned weights in response. The real-time measurements may then be processed by the neural network tuned by those learned weights to generate an economic dispatch.

As illustrated in FIG. 13, the scenarios provided by the scenarios circuit 708 are the inputs to the neural network of the offline dispatch generation circuit 706 and the economic dispatch is the output of the neural network. The weight selector circuit 710 determines weights based on the costs generated by the system model simulator circuit 704. The scenarios circuit 708 allows the training system 700 to be exposed to a large number of scenarios, including scenarios which may be difficult to find in real-world data, without the need to wait for such scenarios to occur in the real world. Further, the system model simulator circuit 704 replaces the need to wait for real-world cost data by producing simulated costs. The scenarios circuit 708 and the system model simulator circuit 704 thereby combine to facilitate training of the neural network using model-based data. Thus, even though real-world data may be insufficient to train the neural network, the training system 700 reliably produces learned weights for use by the dispatch generation circuit 604.

Referring again to FIG. 12, the learned weights generated by the training system 700 are provided to the dispatch generation circuit 604. The dispatch generation circuit 604 applies the learned weights in the neural network of the dispatch generation circuit 604. The dispatch generation circuit 604 is thereby configured to receive a set of real-time equipment statuses and measurement values (i.e., a real-world scenario, operating online to control an actual set of building equipment) and generate an economic dispatch that minimizes cost, for example a resource consumption cost or some other cost function. Because the neural network and the dispatch generation circuit 604 may require substantially less computing power than traditional online control methods, the system manager 502 may be more efficient, consume less energy, and include cheaper computing components as compared to control systems using traditional approaches.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

As used herein, the term "circuit" may include hardware structured to execute the functions described herein. In some embodiments, each respective "circuit" may include machine-readable media for configuring the hardware to execute the functions described herein. The circuit may be embodied as one or more circuitry components including, but not limited to, processing circuitry, network interfaces, peripheral devices, input devices, output devices, sensors, etc. In some embodiments, a circuit may take the form of one or more analog circuits, electronic circuits (e.g., integrated circuits (IC), discrete circuits, system on a chip (SOCs) circuits, etc.), telecommunication circuits, hybrid circuits, and any other type of "circuit." In this regard, the "circuit" may include any type of component for accomplishing or facilitating achievement of the operations described herein. For example, a circuit as described herein may include one or more transistors, logic gates (e.g., NAND, AND, NOR, OR, XOR, NOT, XNOR, etc.), resistors, multiplexers, registers, capacitors, inductors, diodes, wiring, and so on).

The "circuit" may also include one or more processors communicably coupled to one or more memory or memory devices. In this regard, the one or more processors may execute instructions stored in the memory or may execute instructions otherwise accessible to the one or more processors. In some embodiments, the one or more processors may be embodied in various ways. The one or more processors may be constructed in a manner sufficient to perform at least the operations described herein. In some embodiments, the one or more processors may be shared by multiple circuits (e.g., circuit A and circuit B may comprise or otherwise share the same processor which, in some example embodiments, may execute instructions stored, or otherwise accessed, via different areas of memory). Alternatively or additionally, the one or more processors may be structured to perform or otherwise execute certain operations independent of one or more co-processors. In other example embodiments, two or more processors may be coupled via a bus to enable independent, parallel, pipelined, or multi-threaded instruction execution. Each processor may be implemented as one or more general-purpose processors, application specific integrated circuits (ASICs), field programmable gate arrays (FPGAs), digital signal processors (DSPs), or other suitable electronic data processing components structured to execute instructions provided by memory. The one or more processors may take the form of a single core processor, multi-core processor (e.g., a dual core processor, triple core processor, quad core processor, etc.), microprocessor, etc. In some embodiments, the one or more processors may be external to the apparatus, for example the one or more processors may be a remote processor (e.g., a cloud based processor). Alternatively or additionally, the one or more processors may be internal and/or local to the apparatus. In this regard, a given circuit or components thereof may be disposed locally (e.g., as part of a local server, a local computing system, etc.) or remotely (e.g., as part of a remote server such as a cloud based server). To that end, a "circuit" as described herein may include components that are distributed across one or more locations. The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

What is claimed is:

1. A method, comprising:
operating equipment to affect a variable state or condition of a space;
determining a set of learned weights for a neural network by modeling an estimated cost of operating the equipment over a plurality of simulated scenarios, each simulated scenario comprising simulated measurements relating to the space, the neural network configured to generate simulated control dispatches for the equipment based on the simulated measurements;
configuring the neural network for online control by applying the set of learned weights;
applying actual measurements relating to the space to the neural network to generate a control dispatch for the equipment; and
controlling the equipment in accordance with the control dispatch.

2. The method of claim 1, wherein the set of learned weights are determined as a set of weights that minimize the estimated cost of operating the equipment over the plurality of simulated scenarios.

3. The method of claim 1, wherein determining the set of learned weights comprises:
identifying a state-space thermal model for the space;
defining a cost function using the state-space thermal model;
generating, by the neural network for each scenario, a simulated control dispatch based the simulated measurements for the scenario and a set of weights; and
calculating, using the cost function, the estimated cost of operating the equipment over a simulated time period for the scenario given the simulated control dispatch and the simulated measurements.

4. The method of claim 3, wherein determining the set of learned weights further comprises:

modifying the set of weights to drive the estimated cost toward a minimum of the cost function; and determining the set of learned weights as the set of weights that results in a minimum cost over the plurality of simulated scenarios.

5. The method of claim 1, wherein the control dispatch comprises one or more of a temperature setpoint, temperature schedule, humidity setpoint, airflow setpoint, power level, on/off setting, damper position, fan speed, compressor frequency, or resource consumption allocation.

6. The method of claim 1, wherein the equipment comprises one or more of an airside system or a waterside system.

7. The method of claim 1, wherein the equipment comprises one or more of a variable refrigerant flow system, a room air conditioner, or a packaged air conditioner.

8. A system, comprising:

HVAC equipment operable to affect a variable state or condition of a space;

one or more sensors configured to collect measurements relating to the space;

an offline training system configured to determine a set of learned weights for a neural network by modeling an estimated cost of operating the HVAC equipment over a plurality of simulated scenarios, each simulated scenario comprising simulated measurements relating to the space, the neural network configured to generate simulated control dispatches for the HVAC equipment based on the simulated measurements; and an online control circuit configured to:
apply the measurements from the one or more sensors to the neural network to generate a control dispatch for the HVAC equipment, the neural network configured in accordance with the set of learned weights; and control the HVAC equipment in accordance with the control dispatch.

9. The system of claim 8, wherein the offline training system is configured to determine the set of learned weights as a set of weights that minimize the estimated cost of operating the equipment over the plurality of simulated scenarios.

10. The system of claim 8, wherein the offline training system is configured to:

identify a state-space thermal model for the space;

define a cost function using the state-space thermal model;

generate, with the neural network and for each scenario, a simulated control dispatch based the simulated measurements for the scenario and a set of weights; and calculate, using the cost function, the estimated cost of operating the HVAC equipment over a simulated time period for the scenario given the simulated control dispatch and the simulated measurements.

11. The system of claim 10, wherein the offline training system is configured to:

modify the set of weights to drive the estimated cost toward a minimum of the cost function; and determine the set of learned weights as the set of weights that results in a minimum cost over the plurality of simulated scenarios.

12. The system of claim 8, wherein the HVAC equipment comprises one or more of an airside system or a waterside system.

13. The system of claim 8, wherein the online control circuit is included locally with the HVAC equipment and the offline training system comprises one or more cloud-computing resources.

14. A system, comprising:

a cooling device operable to affect a temperature of a space;

one or more sensors configured to collect measurements relating to the space;

an offline training system configured to determine a set of learned weights for a neural network by modeling an estimated cost of operating the cooling device over a plurality of simulated scenarios, each simulated scenario comprising simulated measurements relating to the space, the neural network configured to generate simulated control dispatches for the cooling device based on the simulated measurements; and an online control circuit configured to:
apply the measurements from the one or more sensors to the neural network to generate a control dispatch for the cooling device, the neural network configured in accordance with the set of learned weights; and control the cooling device in accordance with the control dispatch.

15. The system of claim 14, wherein the offline training system is configured to determine the set of learned weights as a set of weights that minimize the estimated cost of operating the cooling device over the plurality of simulated scenarios.

16. The system of claim 14, wherein the offline training system is configured to:

identify a state-space thermal model for the space;

define a cost function using the state-space thermal model;

generate, with the neural network and for each scenario, a simulated control dispatch based the simulated measurements for the scenario and a set of weights; and calculate, using the cost function, the estimated cost of operating the cooling device over a simulated time period for the scenario given the simulated control dispatch and of simulated measurements.

17. The system of claim 16, wherein the offline training system is configured to:

modify the set of weights to drive the estimated cost toward a minimum of the cost function; and determine the set of learned weights as the set of weights that results in a minimum cost over the plurality of simulated scenarios.

18. The system of claim 14, wherein the cooling device comprises one or more of a room air conditioner, a packaged air conditioner, or a variable refrigerant flow device.

19. The system of claim 14, the online control circuit is included locally with the cooling device and the offline training system comprises one or more cloud-computing resources.

20. The system of claim 14, wherein the control dispatch comprises a temperature setpoint.

* * * * *